United States Patent
Kokura et al.

(10) Patent No.: US 7,682,983 B2
(45) Date of Patent: Mar. 23, 2010

(54) MANUFACTURING METHOD OF ELECTRONIC DEVICE WITH RESIST ASHING

(75) Inventors: Hikaru Kokura, Kawasaki (JP); Kenji Nukui, Kawasaki (JP); Shinji Fukuta, Kawasaki (JP); Tadashi Oshima, Kawasaki (JP); Fukashi Harada, Kawasaki (JP); Tatsuro Kawabata, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 119 days.

(21) Appl. No.: 11/487,587

(22) Filed: Jul. 17, 2006

(65) Prior Publication Data
US 2007/0173066 A1    Jul. 26, 2007

(30) Foreign Application Priority Data
Jul. 20, 2005  (JP)  ............... 2005-210353
Jul. 4, 2006    (JP)  ............... 2006-184884

(51) Int. Cl.
*H01L 21/302*  (2006.01)
*H01L 21/461*  (2006.01)
(52) U.S. Cl. .................. 438/715; 438/725
(58) Field of Classification Search ........ 438/706, 438/710, 714, 719, 723, 724, 725
See application file for complete search history.

(56) References Cited

U.S. PATENT DOCUMENTS

| | | | | |
|---|---|---|---|---|
| 5,503,964 | A | * | 4/1996 | Nishina et al. ............ 438/514 |
| 6,043,004 | A | * | 3/2000 | Kurimoto ................. 430/329 |
| 6,429,142 | B1 | * | 8/2002 | Peng et al. ................ 438/725 |
| 2002/0050573 | A1 | * | 5/2002 | Suguro et al. .......... 250/492.21 |
| 2002/0063254 | A1 | * | 5/2002 | Tanaka et al. ............. 257/59 |
| 2004/0224450 | A1 | * | 11/2004 | Itonaga et al. ............ 438/197 |
| 2004/0261817 | A1 | * | 12/2004 | Araki et al. .................. 134/2 |
| 2005/0019964 | A1 | * | 1/2005 | Chang et al. .............. 438/16 |
| 2007/0054492 | A1 | * | 3/2007 | Elliott et al. ............. 438/689 |

FOREIGN PATENT DOCUMENTS

| | | |
|---|---|---|
| JP | 5-275326 | 10/1993 |
| JP | 11-97421 | 4/1999 |
| JP | 11-345771 | 12/1999 |
| JP | 2001-319885 | 11/2001 |

* cited by examiner

*Primary Examiner*—Allan Olsen
(74) *Attorney, Agent, or Firm*—Fujitsu Patent Center

(57) ABSTRACT

A manufacturing method of an electronic device, includes the steps of: implanting P (phosphorous) ions into a substrate semiconductor region made of Si or SiGe by using a resist as a mask; ashing the resist while it is heated in a vacuum environment; and taking out the substrate, the substrate being ashing processed so that a temperature of the substrate is equal to or less than 130° C.

16 Claims, 25 Drawing Sheets

MANUFACTURING METHOD OF ELECTRONIC DEVICE WITH RESIST ASHING

BACKGROUND OF THE INVENTION

1. Field of the Invention

The present invention generally relates to manufacturing methods of electronic devices, and more specifically, to a manufacturing method of an electronic device, the method including a step of removing a resist by ashing after P (phosphorus) ions are implanted.

2. Description of the Related Art

Conventionally and continuously, in a manufacturing process of an electronic device such as a manufacturing process of a semiconductor device or a manufacturing process of a liquid crystal panel or an active substrate of an organic EL panel, an ion implantation method has been used for forming a source/drain region or the like. A photoresist has been used as an ion implantation mask.

After the ion implantation, it is necessary to remove this photoresist mask. Recently, instead of a wet process using removal liquid for removing this photoresist mask, an ashing process using $O_2$ plasma has been used. An example of a related art ashing step is discussed with reference to FIG. 1 and FIG. 2 (See Japanese Laid-Open Patent Application Publication No. 11-097421). Here, FIG. 1 is a first view explaining a related art ashing step. FIG. 2 is a second view explaining a related art ashing step.

Referring to FIG. 1, first, an element isolation region 202 is formed in a p-type silicon substrate 201 so that an element forming region is defined. After that, a phosphorus (P) ion is implanted in a part of the element forming region so that an n-type well region 203 and a boron (B) ion is implanted in another part of the element forming region so that a p-type well region 204 is formed.

Next, after a gate dielectric film 205 is formed by applying a thermal oxidation process, gate electrodes 206 and 207 are formed by forming a polysilicon film on an entire surface and by patterning.

Then, P ions 209 are implanted into the p-type well region 204 in a state where the n-type well region 203 is covered with the resist mask 208, so that an n-type source/drain region 210 is formed.

A deformed layer 211 due to the implantation of the P ion is formed on a surface of the resist mask 208.

Next, cations and electrons are removed from plasma of gas where $O_2$ is the main ingredient and $N_2$, $H_2$, and $CF_4$ are added so that a neutral radical environment 212 is made. In the neutral radical environment 212, an ashing process is applied and thereby the deformed layer 211 and the resist mask 208 are removed.

In a case where the ashing process is implemented at a high temperature so that processing speed is made high, in order to prevent a phenomenon where non-deformed resist pops, a step for removing the deformed layer 211 is implemented at 150° C. of substrate temperature. After the deformed layer 211 is removed, the non-deformed resist mask 208 is removed at 200° C. of the substrate temperature.

Referring to FIG. 2, after the processed substrate is taken out to the atmosphere, a cleaning process using a sulfuric acid water solution is applied to the processed substrate so that ashing residual is removed. After that, B ions are implanted into the n-type well region 203 in a state where the p-type well region 204 is covered with the resist mask 213, and thereby a p-type source/drain region 215 is formed.

Next, cations and electrons are removed from plasma of gas where $O_2$ is the main ingredient and $N_2$, $H_2$, and $CF_4$ are added so that neutral radical environment 217 is made. In the neutral radical environment 217, an ashing process is applied and thereby a deformed layer 216 and the resist mask 213 are removed. As a result of this, a basic part of a CMOS transistor is formed.

In this case, in order to prevent the popping phenomenon, a step for removing the deformed layer 216 is implemented at 150° C. substrate temperature. After the deformed layer 216 is removed, non-deformed resist mask 213 is removed at 200° C. substrate temperature.

On the other hand, a technique where, in order to implement the ashing process at a constant substrate temperature, the ashing process is applied to the deformed layer in $O_2$ plasma including 1% of $CF_4$ and at 180° C. substrate temperature so that the deformed layer is removed, and then the ashing process is applied to a non-deformed resist mask in $O_2$ plasma including 5% $N_2$.

As accompanying making the speed of the semiconductor device high, in order to achieve an increase of the driving electric current and the reduction of a leakage current, implantation of impurities is repeated a considerable number of times. It is necessary to remove the resist used as the ion implantation mask. Hence, as the number of implantations is increased, the number of removals of the resist is increased. This causes an increase of the manufacturing time.

Accordingly, currently, as discussed above, the substrate temperature at the time of removing the resist is equal to or higher than 150° C., and thereby reaction speed is made high and the resist removal time is reduced.

Furthermore, in the ashing device having a load lock room, in a case where a semiconductor wafer processed at high temperature is taken out to the atmosphere via the load lock room, temperature unevenness is generated between a part contacting with a substrate supporting jig such as an arm and a non-contacting part. As a result of this, heat deformation may be generated when the semiconductor wafer is rapidly cooled in the atmosphere so that the semiconductor wafer may be warped. Alternatively, thermal stress may be generated so that breakage or short-circuiting of wiring may occur.

Japanese Laid-Open Patent Application Publication No. 11-345771 discloses a technique where a cooling mechanism is provided at the load lock room, a processed semiconductor wafer is mounted on a wafer mounting stage provided at the load lock room so that uniform heat distribution is maintained, and the temperature of the semiconductor wafer is decreased to a designated temperature.

Japanese Laid-Open Patent Application Publication No. 2001-319885 discloses a technique where the processed wafer is self-cooled by opening the load lock room when the pressure of the load lock room becomes atmospheric pressure or by leading inactive gas into the load lock room when the pressure of the load lock room is changed to atmospheric temperature.

However, the inventor of the present invention found that a Si digging phenomenon occurs in the ashing step after P having a high density of $5 \times 10^{15}$ $cm^{-2}$ is ion-implanted. The Si digging phenomenon is a phenomenon where a P implantation region or a polysilicon layer where P is implanted of the silicon substrate is undesirably etched.

FIG. 3 is a cross-sectional view of a main part after a contact hole is formed. More specifically, FIG. 3 is a sketch of an electron micrograph image and a cross-sectional view in a direction parallel with an extending direction of a gate electrode.

FIG. 3-(A) shows a normal state and FIG. 3-(B) shows an abnormal state. Referring to FIG. 3-(B), a hollow part 226 is formed at a corner of a contact hole 224 of a silicon substrate 221 where P is implanted. Furthermore, a hollow part 227 is formed in a region neighboring the contact hole 224.

Since the hollow part 227 in the region neighboring to the contact hole 224 is generated before the contact hole 224 is formed, a step before the contact hole 224 with the hollow part 226 is formed, namely the ashing step after the P ion implantation region is formed, may be the reason for this situation.

FIG. 4 is a cross-sectional view of a state where a resist used as a mask is removed by ashing after the polysilicon layer for the gate electrode is formed and the P ions are partially implanted in order to form an n channel type FET gate electrode and a gate extraction electrode. FIG. 4 is a sketch of an electron micrograph image.

Referring to FIG. 4, the film thickness of a P implantation part of a polysilicon layer is thinner than a non-implantation part situated at the left end side of FIG. 4. This shows that undesirable etching is generated.

Such a Si digging defect causes an increase on the value of resistance of a diffusion resistance layer or a wiring layer so that a signal delay or decrease of the driving electrical current may happen.

In a case where B ions are implanted as shown in FIG. 5-(A), as compared to the P ion implantation shown in FIG. 5-(B), the Si digging defect shown in FIG. 5-(C) does not occur at all. This situation is applied to a case of another impurity such as As and it is confirmed that this situation is peculiar to P.

FIG. 6 is a view for explaining distribution of the Si digging defects.

FIG. 6-(A) shows a distribution indicated by dots without the Si digging defect, in a case where the wafer is taken to the atmosphere after a long time such as approximately 30 through 60 seconds has passed after the ashing process. The distribution is almost even in the wafer.

FIG. 6-(B) shows distribution showing the Si digging defect in a case where the wafer is taken to the atmosphere after a short time such as approximately 10 seconds passes after the ashing process, by dots. The defect in the case of FIG. 6-(B) is larger than the case of FIG. 6-(A) by the Si digging defects.

Thus, if the time period from the time of the ashing process to the time when the wafer is taken out to the atmosphere is long, the temperature of the wafer is decreased so that it may be difficult to generate the Si digging defects.

SUMMARY OF THE INVENTION

Accordingly, embodiments of the present invention may provide a novel and useful manufacturing method of an electronic device solving one or more of the problems discussed above.

More specifically, the embodiments of the present invention may provide a manufacturing method of an electronic device whereby generation of Si digging defects due to the ashing step after the phosphorus (P) ions are implanted can be prevented.

One aspect of the present invention may be to provide a manufacturing method of an electronic device whereby generation of the Si digging defects due to the ashing step after the phosphorus (P) ions are implanted can be prevented without decreasing throughput.

It may be also the aspect of the present invention to provide a manufacturing method of an electronic device, including the steps of: implanting P (phosphorous) ions into a substrate semiconductor region made of Si or SiGe by using a resist as a mask; ashing the resist while it is heated in a vacuum environment; and taking out the substrate, the substrate being ashing processed so that a temperature of the substrate is equal to or less than 130° C.

According to the above-mentioned manufacturing method of the electronic device, the substrate having been ashing processed due to the P ion implantation is directly taken out to the atmosphere at a temperature equal to or less than 130° C. Therefore, the generation of the Si digging defects at a semiconductor region made of Si or SiGe can be prevented.

It may be also the aspect of the present invention to provide a manufacturing method of an electronic device, including the steps of: implanting P (phosphorous) ions into a substrate semiconductor region made of Si or SiGe by using a resist as a mask; ashing the resist while it is heated in a vacuum environment; forming a protection film covering a surface of the semiconductor region where P (phosphorous) is implanted in the vacuum environment; taking out the substrate where the protection film is formed to the atmosphere; and removing the protection film after the substrate is cooled.

According to the above-mentioned manufacturing method of the electronic device, the protection film is formed on the surface of the semiconductor region where P is implanted so that the contact between water in the atmosphere and the semiconductor region can be avoided. Hence, even if the substrate is taken out to the atmosphere in the state where the substrate is not cooled, the generation of the Si digging defects can be prevented.

It may be also the aspect of the present invention to provide a manufacturing method of an electronic device, including the steps of: implanting P (phosphorous) ions into a substrate semiconductor region made of Si or SiGe by using a resist as a mask; ashing the resist while it is heated in a vacuum environment; and thermal processing the substrate for activating the P (phosphorous) ions implanted in the vacuum environment.

According to the above-mentioned manufacturing method of the electronic device, the activate heating process is applied in a vacuum environment after the ashing process due to the P ion implantation is applied, and thereby P is replaced at a crystal lattice position of Si or the like so that the reactivity of P is reduced.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 7 through FIG. 25 of embodiments of the present invention.

The inventor of the present invention colludes that the reason why the Si digging defect is generated is as follows. That is, if the wafer where P (phosphorus) having high dose amounts equal to or greater than $5 \times 10^{15}$ cm$^{-2}$, more specifically dose amounts of equal to or greater than $6 \times 10^{15}$ cm$^{-1}$ after the ashing process is applied is exposed to the atmosphere at a high temperature, especially a substrate temperature exceeding 130° C., P of the exposed ion implantation region and O and H in the atmosphere react so that orthophosphoric acid ($H_3PO_4$) is generated and this $H_3PO_4$ dissolves Si.

Furthermore, it was found by the inventor of the present invention that fluorine (F) and hydrogen (H) remaining on the surface are reacted with each other by ashing plasma so that hydrogen fluoride (HF) is generated and thereby a natural oxide film having thickness equal to or less than 2 nm and formed on the surface of the ion implantation film is dissolved. As a result of this, the ion implantation region is exposed so that the above-mentioned reaction is further promoted.

Figure 1:
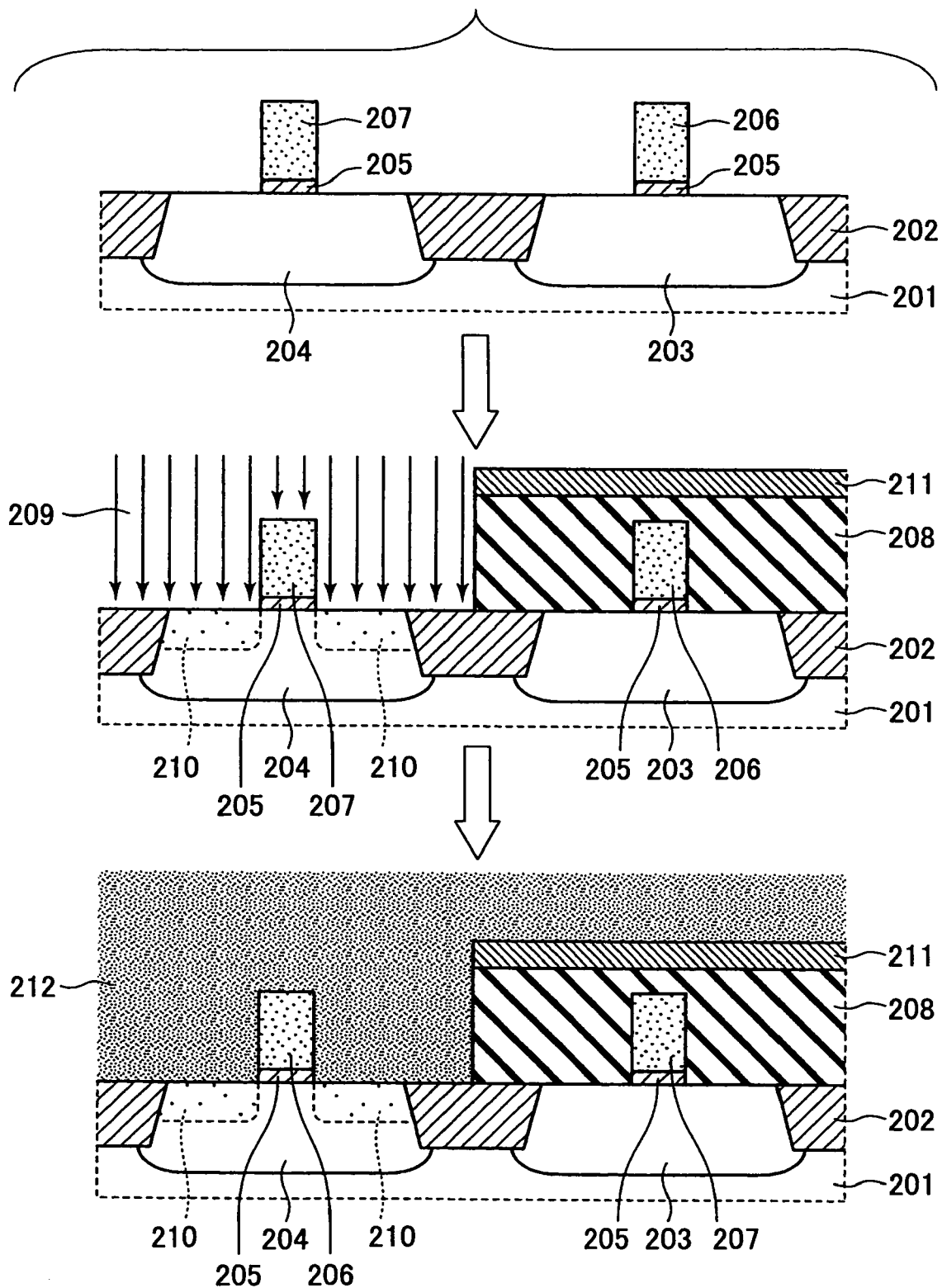
FIG. 1 is a first view explaining a related art ashing step.
Figure 2:
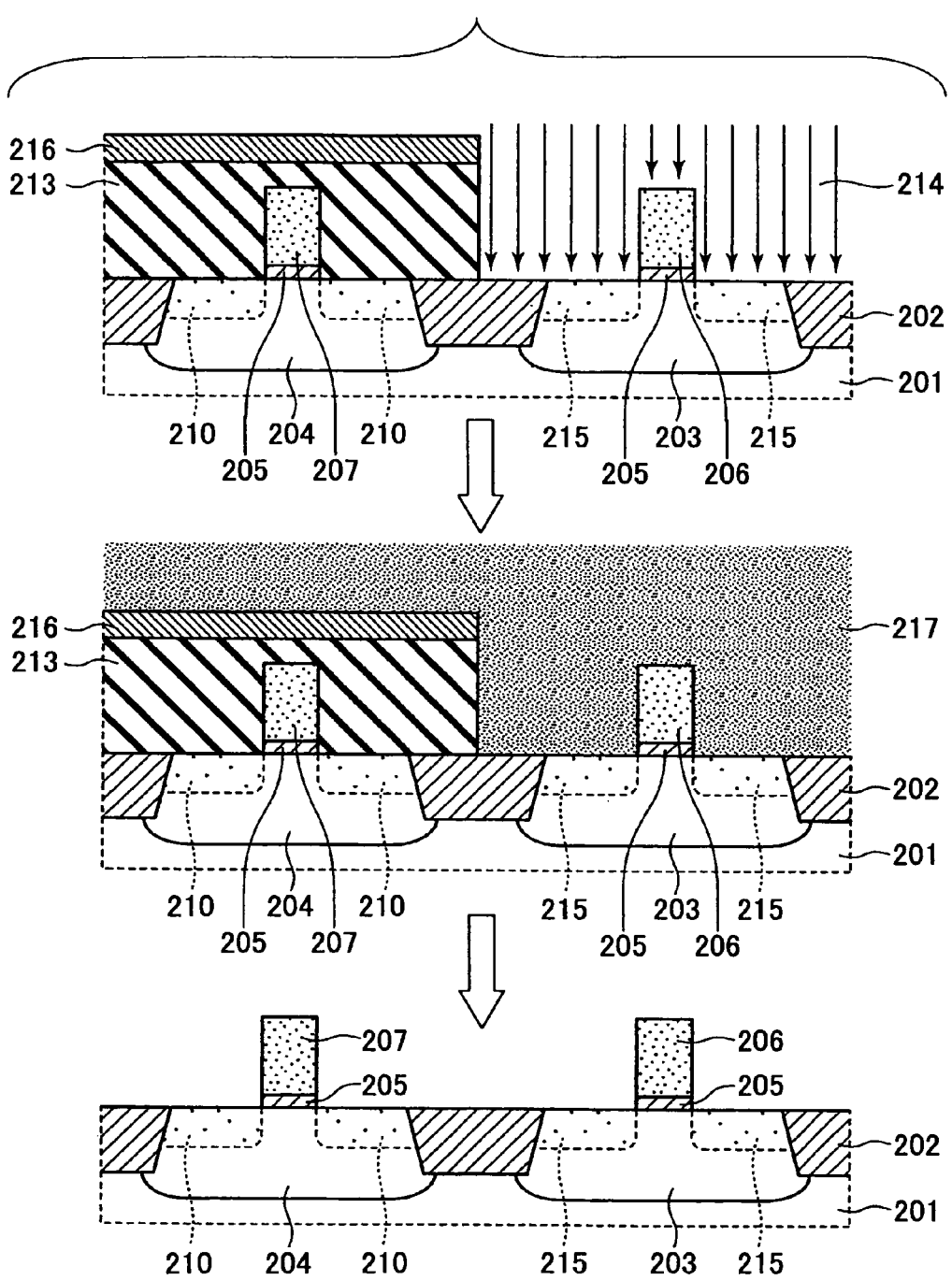
FIG. 2 is a second view explaining a related art ashing step.
Figure 3:
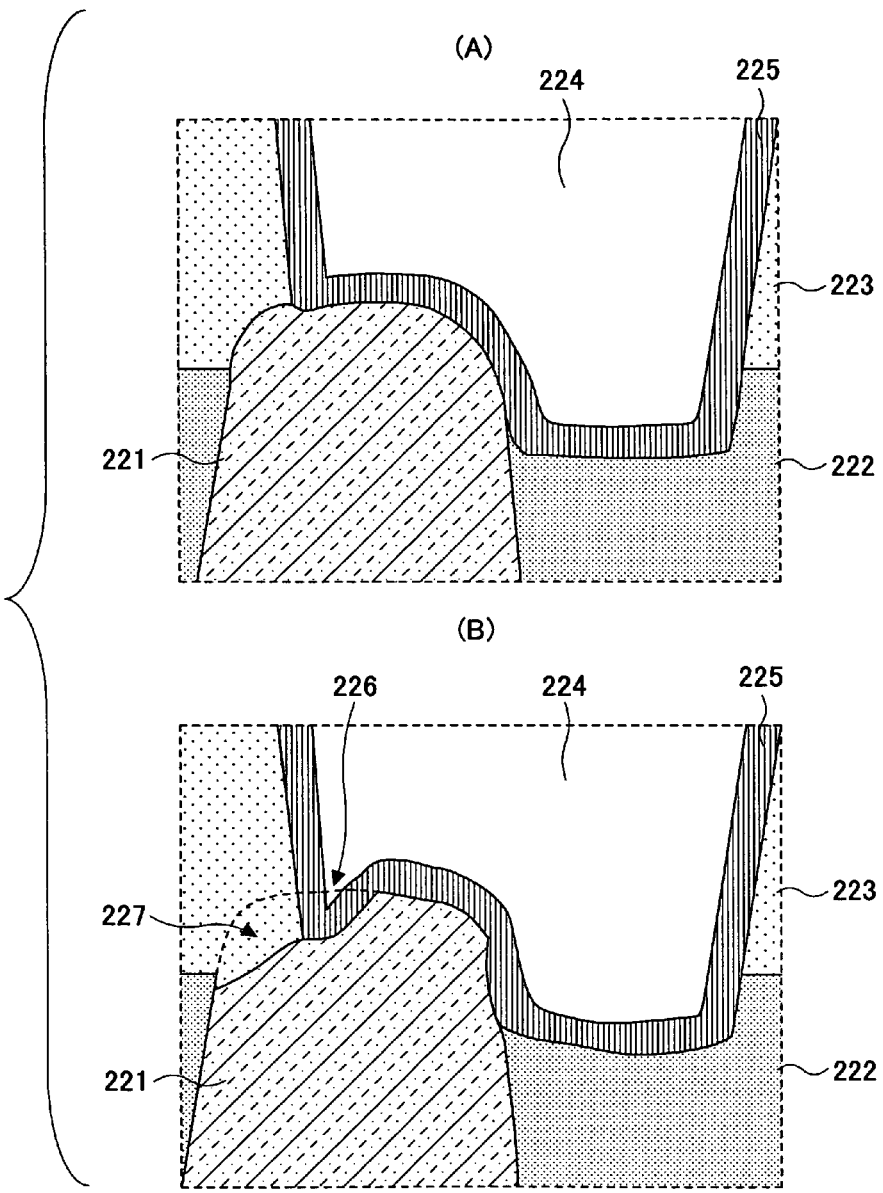
FIG. 3 is a cross-sectional view of a main part after a contact hole is formed.
Figure 4:
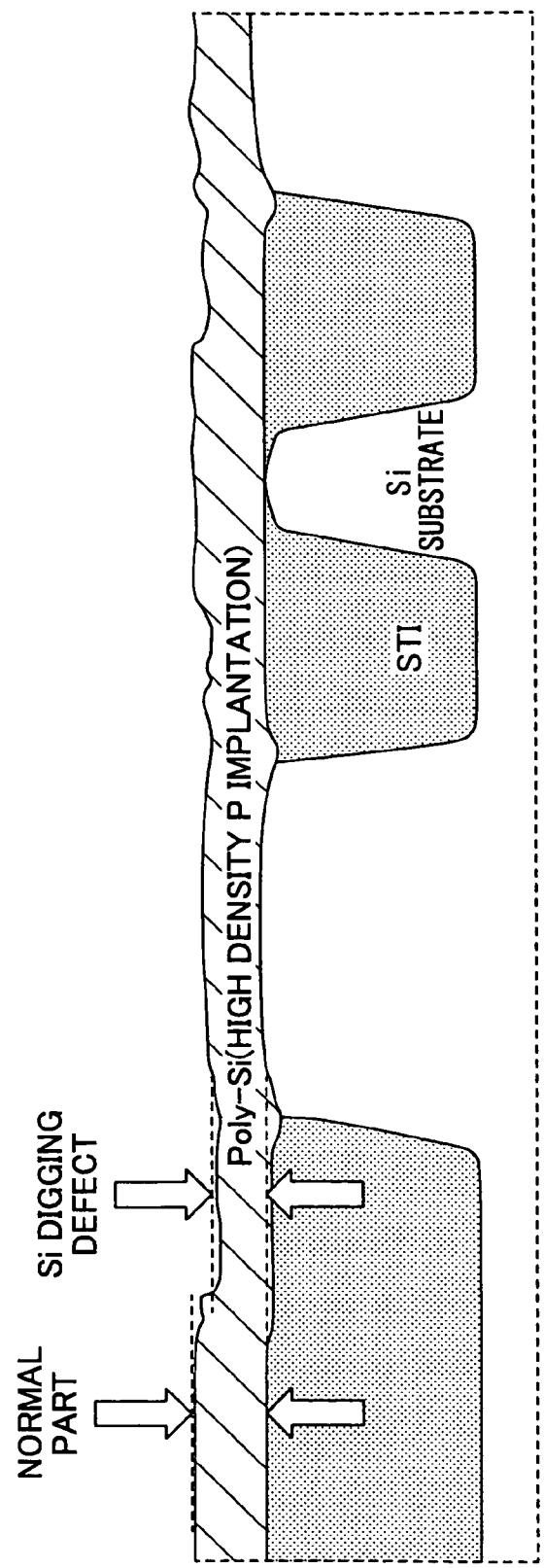
FIG. 4 is a cross-sectional view of a gate electrode after a resist is removed by ashing.
Figure 5:
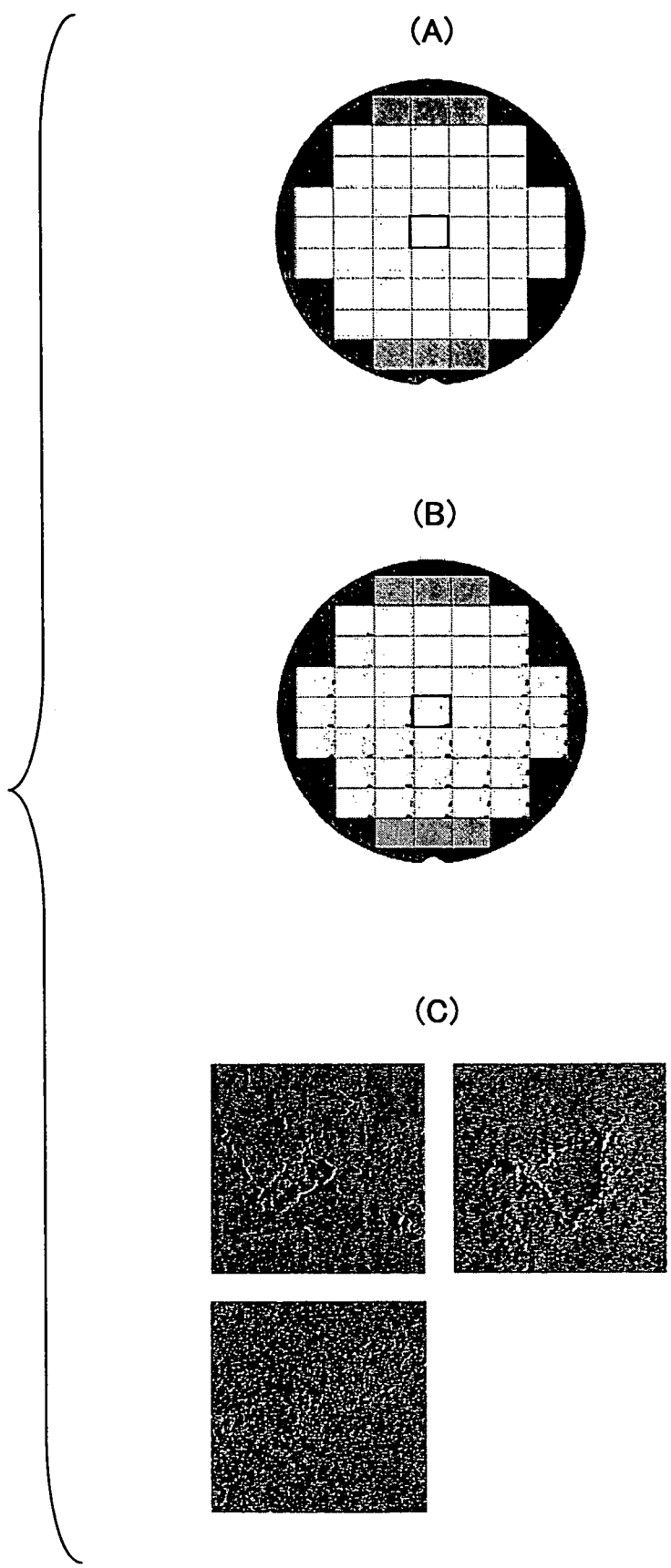
FIG. 5 is a view for explaining implantation impurity dependence of a Si digging defect.
Figure 6:
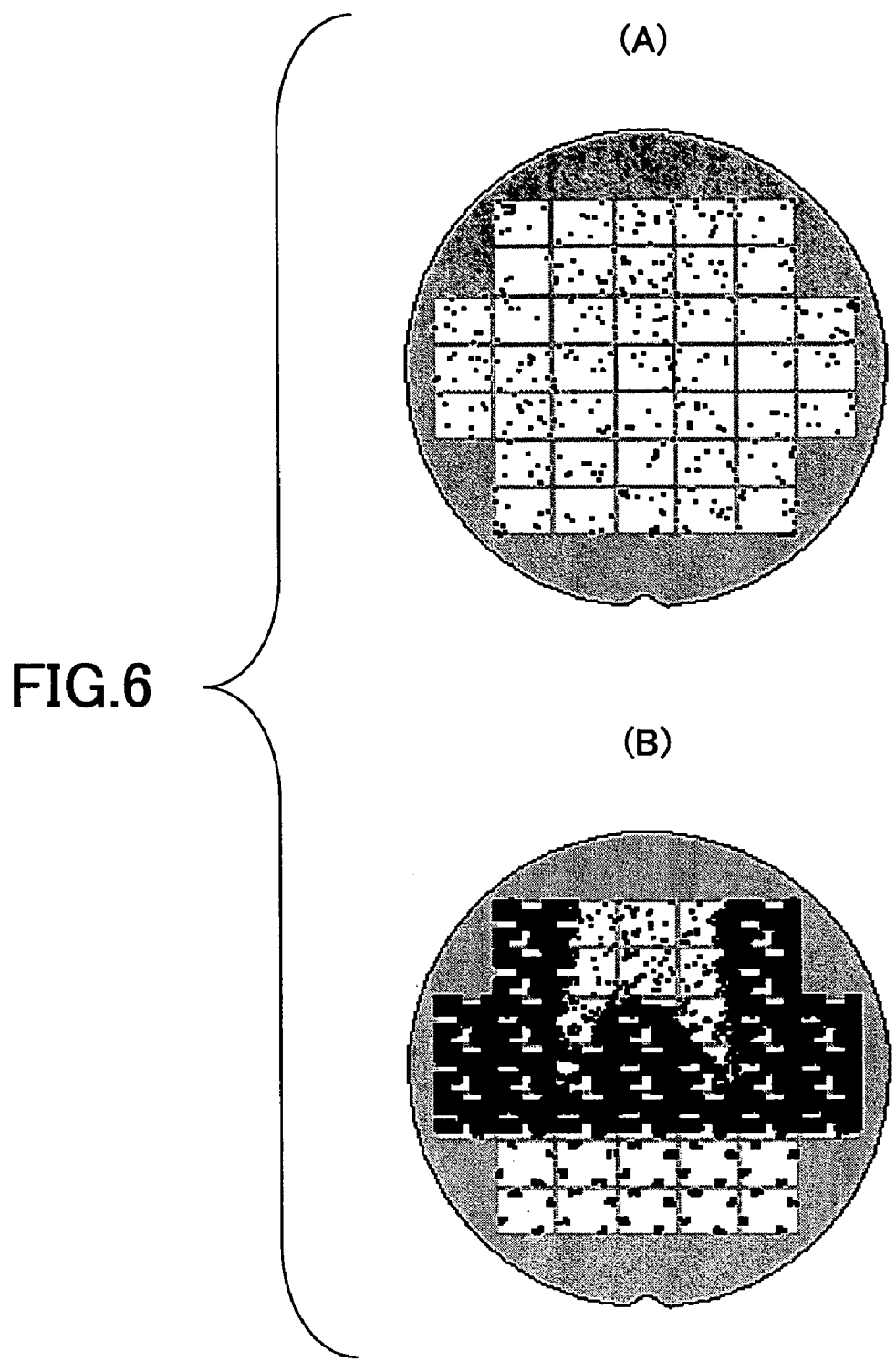
FIG. 6 is a view for explaining distribution of the Si digging defect.
Figure 7:
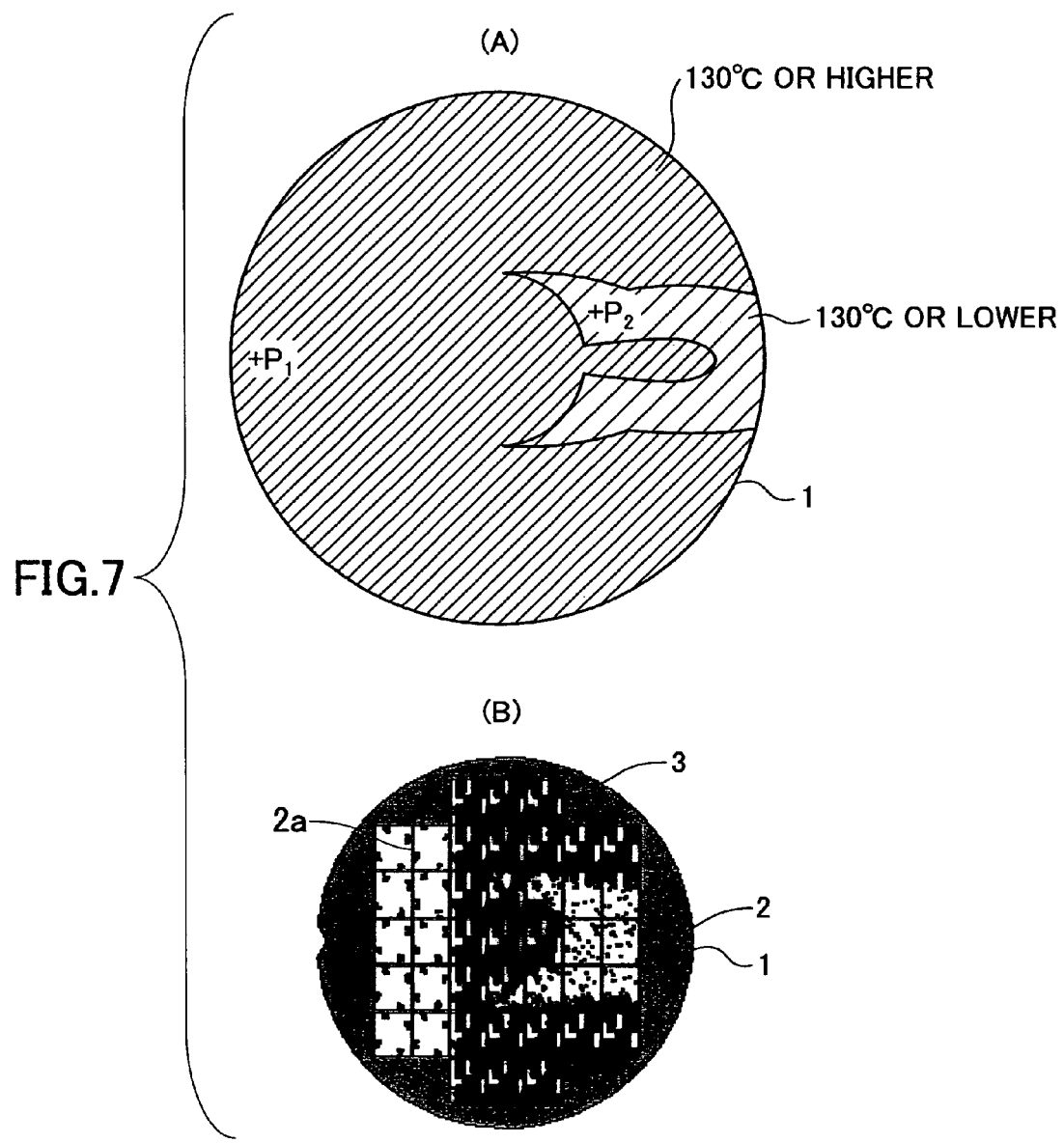
FIG. 7 is a view for explaining an effect of an embodiment of the present invention.

FIG. 7 is a view for explaining an effect of the present invention.

FIG. 7-(A) shows a temperature distribution of a substrate 1 in a case where after P is implanted at dose amounts of $5 \times 10^{15}$ cm$^{-2}$, the ashing process is applied to the substrate 1 at a stage temperature of approximately 250° C. and the substrate 1 is taken out by an arm While a part P1 not contacting with the arm has its highest temperature of approximately 153° C. at exposure to atmosphere, a part P2 contacting the arm and having the lowest substrate temperature due to the contact with the arm has temperature of approximately 112° C.

Since the ashing process in this case is applied in a state where the substrate 1 is lifted from the stage by pins, the substrate temperature is different from the stage temperature and lower than the stage temperature by approximately 100° C.

FIG. 7-(B) shows a distribution of the Si digging defect 3 at the substrate 1 after the substrate 1 is taken out to the atmosphere. While a large number of the Si digging defects 3 are generated at the substrate 1 except the part contacting the arm, the Si digging defects 3 are not generated at the part contacting the arm.

It looks like the number of the Si digging defects 3 at a chip 2 at a left side of the substrate 1 is small. This is because a measuring device stops measurement due to overflow and actually a large number of the Si digging defects 3 are generated.

Figure 8:
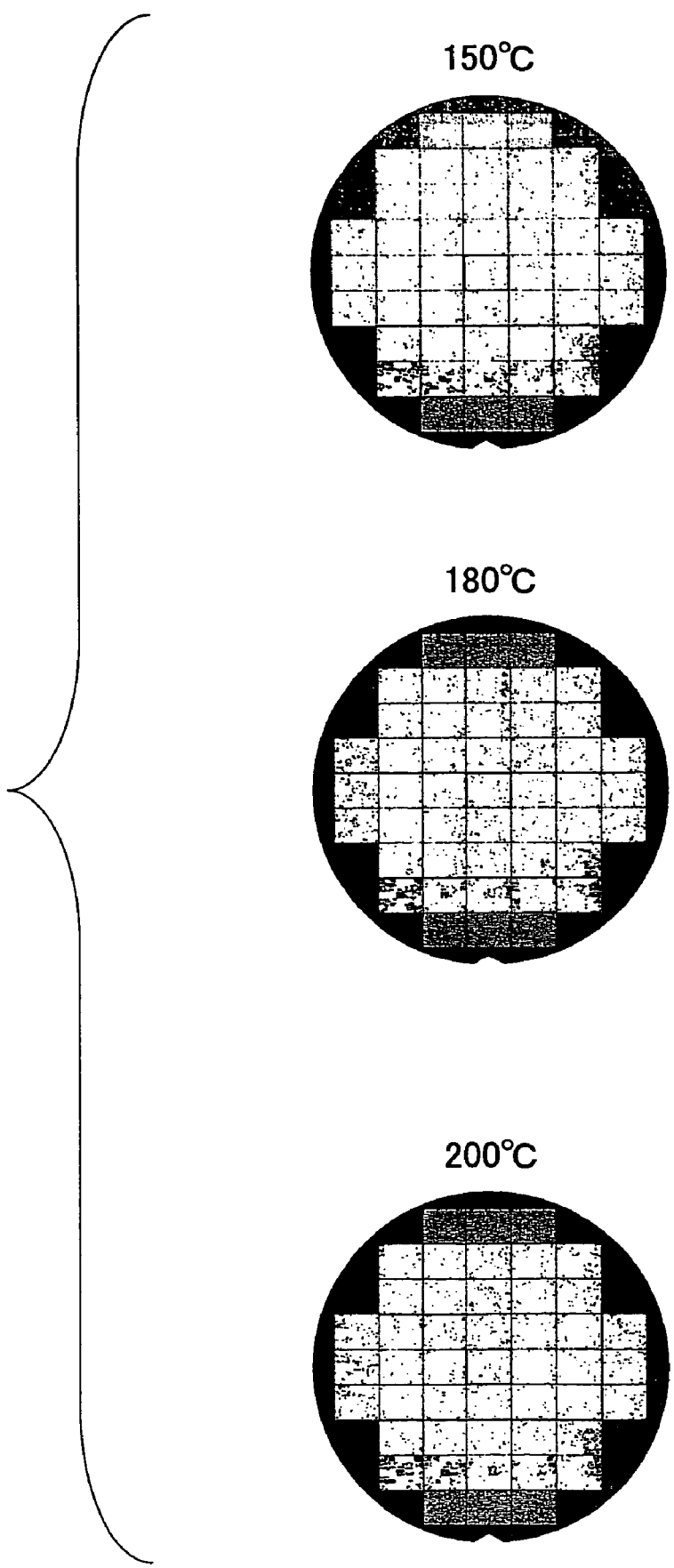
FIG. 8 is a view for explaining stage temperature dependence of a Si digging defect in a case where stage temperatures are 150° C., 180° C., and 200° C.
Figure 9:
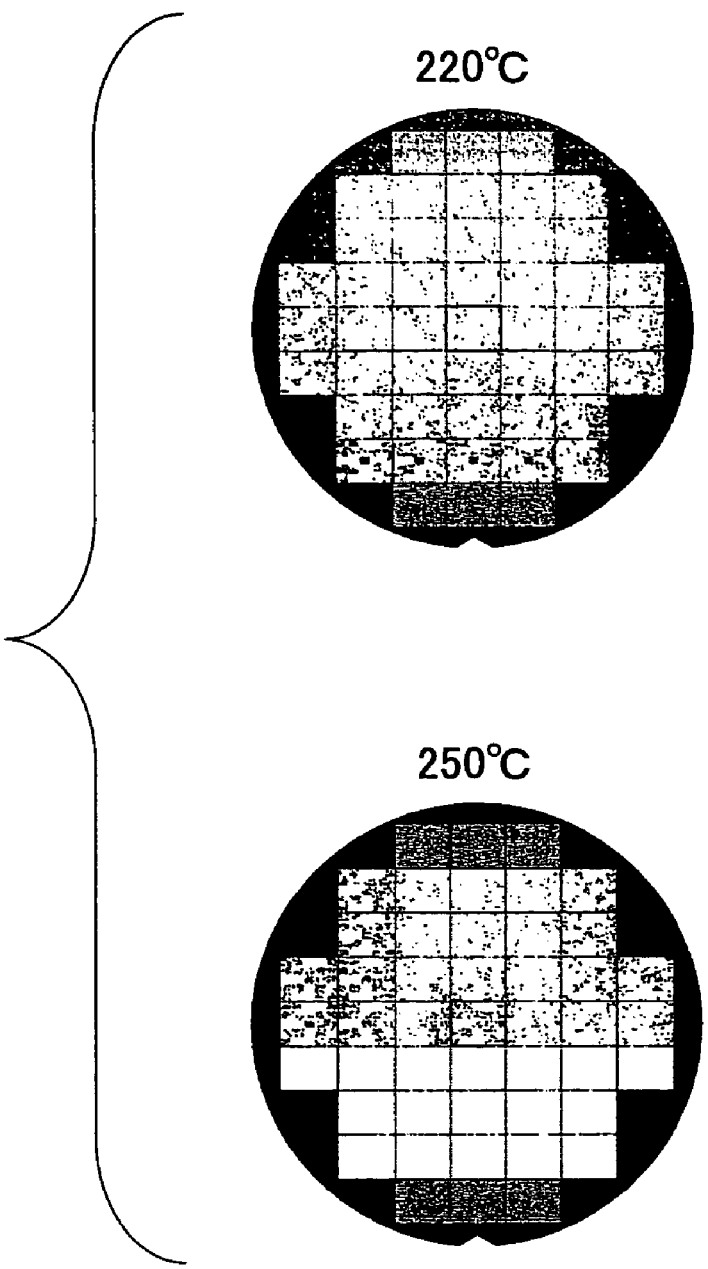
FIG. 9 is a view for explaining stage temperature dependence of a Si digging defect in a case where stage temperatures are 220° C., and 250° C.

FIG. 8 is a view for explaining stage temperature dependence of a Si digging defect in a case where stage temperatures are 150° C., 180° C., and 200° C. FIG. 9 is a view for explaining stage temperature dependence of a Si digging defect in a case where stage temperatures are 220° C., and 250° C.

The substrate temperature is lower than the stage temperature by approximately 100° C. Dots in FIG. 8 and FIG. 9 show various defects including Si digging defects.

As clearly shown in FIG. 8 and FIG. 9, at the stage temperature of 150° C. through 220° C., there is a random distribution of the defects and there are almost no Si digging defects.

On the other hand, at the stage temperature of 250° C., there is an arm type distribution. In a region contacting the taking-out arm, the Si digging defects are not found. In a region not contacting the arm, a lot of Si digging defects are found.

This is because, as shown in FIG. 7-(A), when the stage temperature is 250° C., while the substrate temperature of the region not contacting the arm is approximately 150° C., the substrate temperature contacting the arm is equal to or less than 130° C.

Therefore, when the stage temperature is equal to or less than 220° C., the substrate temperature is equal to or less than 130° C. Hence, when the wafer is exposed to the atmosphere, the generation of $H_3PO_4$ is prevented so that the generation of the Si digging defects is reduced.

According to the above-discussed experimental result, by setting the temperature of the substrate 1 when the substrate 1 after the ashing process is applied is taken out from the ashing processing room to the atmosphere to be equal to or lower than approximately 130° C., it is possible to avoid the Si digging defects due to generation of $H_3PO_4$.

The condition of the temperature being equal to or lower than approximately 130° C. is set according the experimental result discussed below.

The temperature of the substrate 1 at, at least, a last part of the ashing process step may be equal to or lower than approximately 130° C. so that the Si digging defects due to generation of $H_3PO_4$ is not generated. As a result of this, the cooling time can be unnecessary.

Alternatively, after the ashing processing step, the cooling gas may be blown onto the semiconductor in the ashing processing room. As a result of this, the time for cooling to 130° C. or lower can be drastically reduced and a structure in the load lock room if provided can be simplified.

Alternatively, after the ashing processing step, in the ashing processing room, three-fourths or larger of the bottom area of the substrate 1 may be in contact with a subject having a temperature lower than the substrate 1 just after the ashing process, for example, the arm having a large contact area. As a result of this, the cooling time can be unnecessary.

In this case, in order to make heat exchange between the arm and wafer precisely, a cooling mechanism such as a circulation mechanism of a coolant may be provided at the arm itself, or the arm is made to come in contact with the cooling medium provided outside of the ashing processing room at the time of stand-by so that the arm can be cooled.

In addition, in the manufacturing method of the electronic device of the embodiment of the present invention, P ions are implanted into the semiconductor device made of Si or SiGe by using the resist as a mask. Then, while the resist is heated in a vacuum environment, the resist is ashing processed, for example, in an excitation gas environment having oxygen as a main ingredient and including a chemical element promoting the ashing at, at least, the initial time. After that, in the ashing processing device, at least an implantation region surface of P is covered with the protection film in the ashing processing device.

Thus, at least the implantation region surface of P is covered with the protection film so that the implantation region surface of P is not directly exposed to the atmosphere when the substrate 1b is taken out from the ashing processing device so that generation of $H_3PO_4$ causing the Si digging defect is prevented.

Such a protection film may be an oxidization layer formed on the implantation region surface of P by an additional excitation gas process or a plasma process typically. The protection film may be a layer made of a mixture of carbon or fluoride by an additional excitation gas process or a plasma process typically.

In addition, in the manufacturing method of the electronic device of the embodiment of the present invention, P ions are implanted into the semiconductor device made of Si or SiGe by using the resist as a mask. Then, while the resist is heated in a vacuum environment, the resist is ashing processed, for example, in an excitation gas environment having oxygen as a main ingredient and including a chemical element promoting the ashing at, at least, the initial time. After that, while at least a vacuum environment is kept, a thermal process for activating the implanted P ions is implemented.

This thermal process may be implemented in an annealing device connected to the ashing device via the gate valve or under a structure where a lamp for lamp annealing is provided at the ashing device.

Thus, by applying the thermal process for activating the implanted P ions, P converts Si of an Si crystal so as to enter a crystal lattice position. As a result of this, a bonding force with H or O is decreased so that the generation of $H_3PO_4$ is prevented.

The above mentioned generation of the Si digging defect 3 may frequently happen when the implantation dose amount of P is equal to or greater than $5 \times 10^{15}$ cm$^{-2}$, especially equal to or greater than $6 \times 10^{15}$ cm$^{-2}$.

In addition, the above-mentioned ashing process may be implemented in the same excitation gas environment or at the same substrate temperature, from the initial time to end time.

Furthermore, the substrate 1 after the ashing process may be directly taken out from the ashing processing room to the atmosphere or taken out from the ashing processing room to the atmosphere via the load lock room. In the case where the substrate 1 is taken out from the ashing processing room to the atmosphere via the load lock room, the substrate 1 is taken out without requiring the cooling time in the load lock room after the process of the last substrate 1 is completed.

Thus, in the manufacturing method of the electronic device of the embodiment of the present invention, P ions are implanted into the semiconductor device made of Si or SiGe by using the resist as a mask, and then the resist may be ashing processed with the substrate temperature equal to or lower than 130° C. in a vacuum environment. Or, after the ashing processing step, cooling gas is blown onto the semiconductor device in the ashing processing room so that the semiconductor device is cooled to a temperature equal to or lower than 130° C. Alternatively, after the ashing processing step, a subject may come in contact with three-fourths or more of a bottom area of the substrate in the ashing processing room. Here, the subject has a temperature lower than the substrate 1 just after the ashing process is applied. For example, an arm having a large contact area is used as the subject. As a result of this, the temperature of the substrate 1 is reduced to be equal to or lower than 130° C. Thus, by making the temperature of the substrate 1 equal to or lower than 130° C. at the time when the ashing processed substrate is taken out from the ashing processing room, it is possible to prevent the generation of $H_3PO_4$ when the substrate 1 is exposed to the atmosphere and the generation of the Si digging defects.

In addition, in the manufacturing method of the electronic device of the embodiment of the present invention, P ions are implanted to the semiconductor device made of Si or SiGe by using the resist as a mask. Then, the resist is ashing processed in a vacuum environment. After that, in the ashing processing device, by an additional plasma process, the surface of the implantation region of P is covered with the oxidization film or the protection film by the CVD method, so that there is no contact between P and the atmosphere. Thus, it is possible to prevent the generation of $H_3PO_4$ when the substrate 1 is exposed to the atmosphere and the generation of the Si digging defects.

In addition, in the manufacturing method of the electronic device of the embodiment of the present invention, P ions are implanted to the semiconductor device made of Si or SiGe by using the resist as a mask. Then, the resist is ashing processed in a vacuum environment. After that, while at least the vacuum environment is kept, by implementing the thermal process for activating the implanted P ions, the bonding force of P, H and O is lowered. Thus, it is possible to prevent the generation of $H_3PO_4$ when the substrate is exposed to the atmosphere and the generation of the Si digging defects.

Next, examples of the present invention are discussed.

FIRST EXAMPLE

Figure 10:
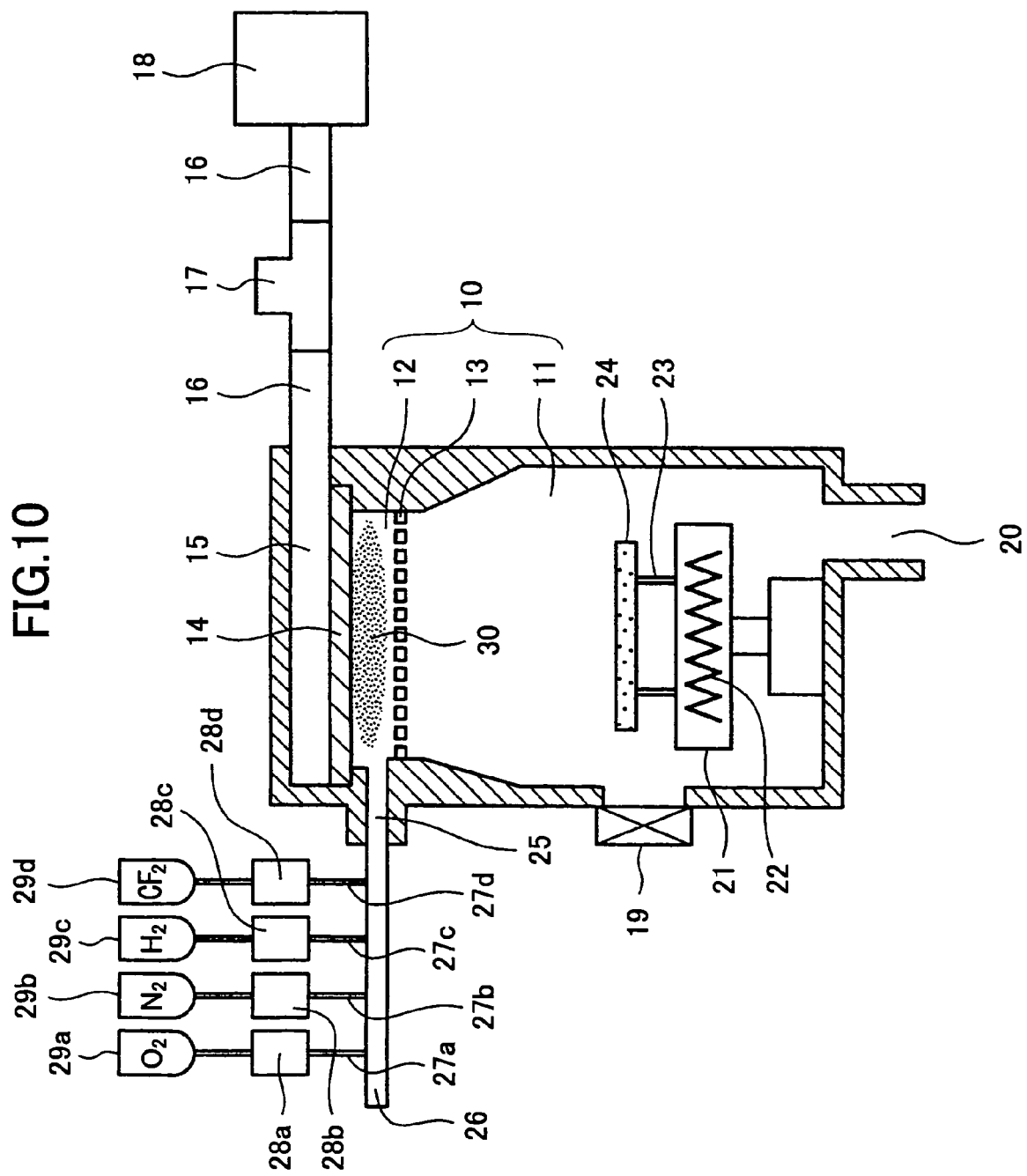
FIG. 10 is a schematic structural view of an ashing processing device used in an embodiment of the present invention.
Figure 11:
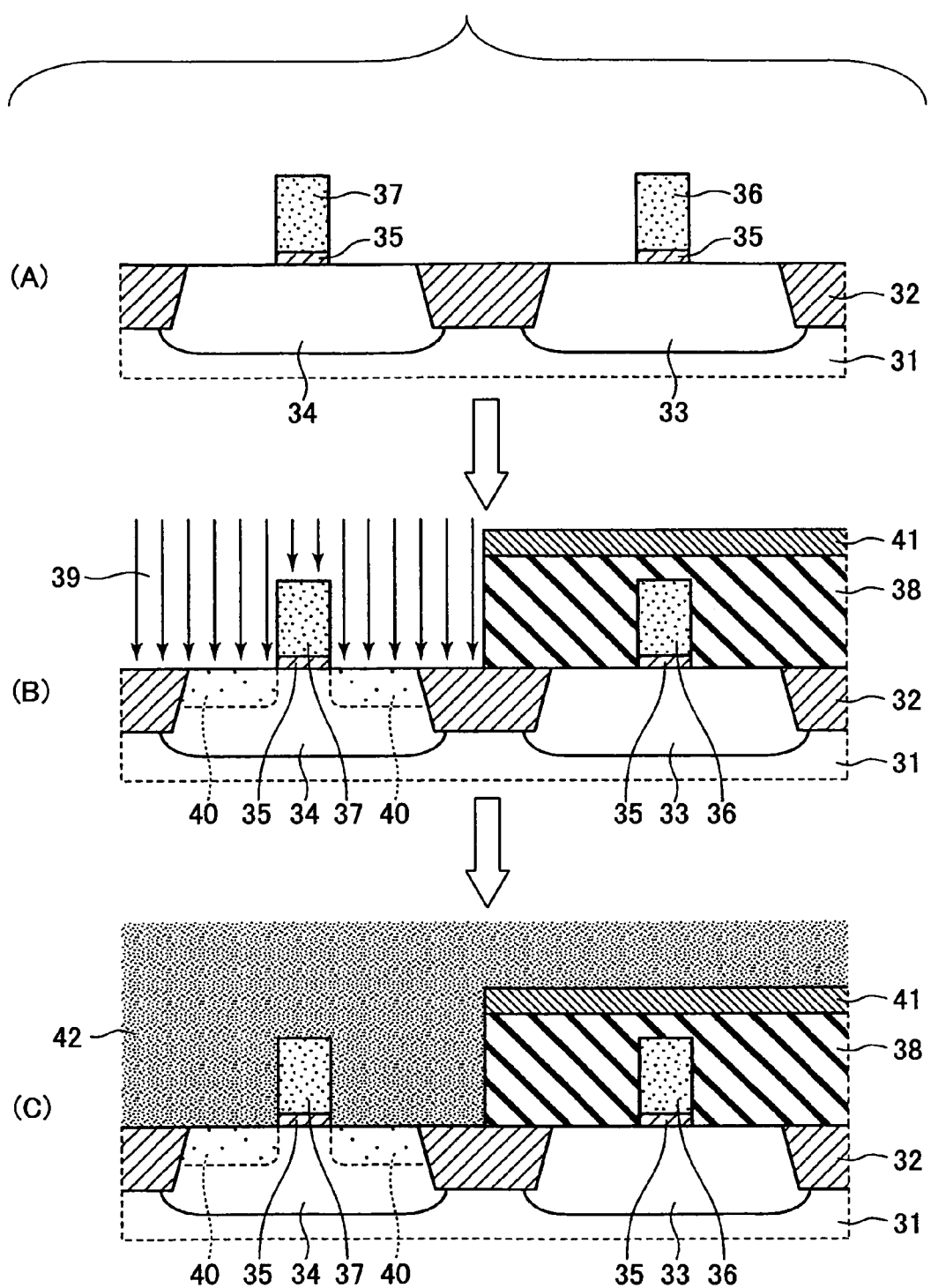
FIG. 11 is a first view for explaining an ashing step of a first example of the present invention.
Figure 12:
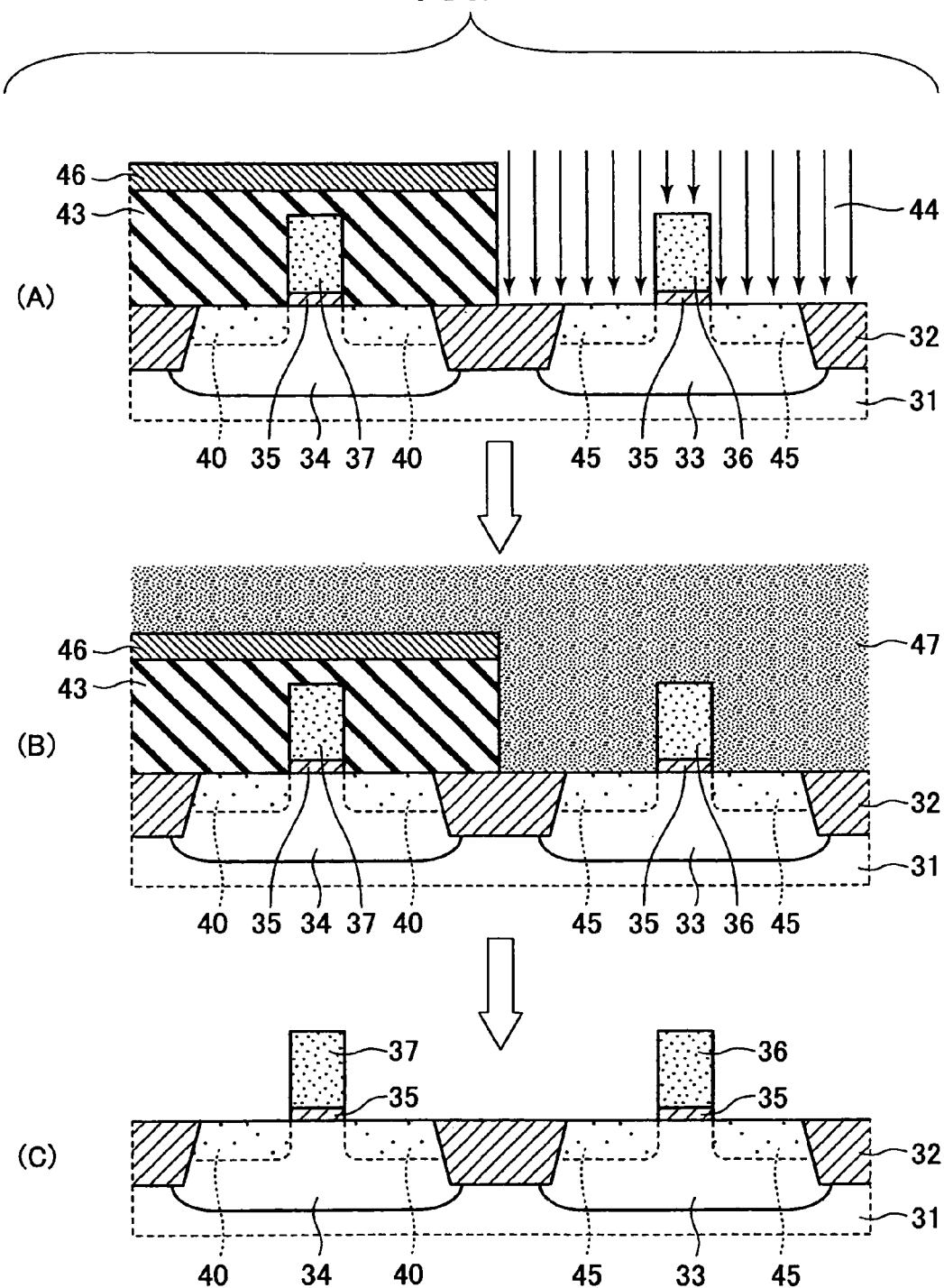
FIG. 12 is a second view for explaining the ashing step of the first example of the present invention.

With reference to FIG. 10 through FIG. 12, an ashing method of the first example of the present invention is discussed.

FIG. 10 is a schematic structural view of an ashing processing device used in the example of the present invention.

Referring to FIG. 10, a reaction chamber 10 includes an ashing processing room 11 and a plasma generation room 12 separated by a shower plate 13. A microwave introducing room 15 is provided above the plasma generation room 12 via a microwave permeation window 14 made of quartz. The microwave introducing room 15 is connected to a magnetron 18 via a microwave guide tube 16 having an auto-tuner 17.

A gate valve 19 through which the wafer is taken in or out and an air exhaust opening 20 are provided at the ashing processing room 11. A stage 21 is provided in the ashing room 11. A heater 11 is installed inside the stage 21. Pins 23 project from the stage 21. A processed substrate 24 is held by the pins 23 in a state where the processed substrate 24 floats from the stage 21.

A gas introducing opening 25 connected to a gas introducing tube 26 is attached to the plasma generation room 12. The gas introducing opening 25 is connected to gas supplying sources 29a through 29d via branching tubes 27a through 27d and mass flow controllers 28a through 28d, respectively. Microwaves are generated in the magnetron 18, introduced to the microwave introducing room 25 via the microwave introducing tube 16, and plasma is produced by the microwave permeating the microwave permeating window 14. The $O_2/N_2/H_2/CF_4$ mixture gas has a main ingredient of O introduced from gas supply sources 29a through 29d via the mass flow controllers 28a through 28d, the branching tubes 27a through 27d, the gas introducing tube 26, and the gas introducing opening 25.

Positive ions and electrons in the plasma 30 whose main ingredient is oxygen plasma are trapped by the grounded shower plate 13. Only neutral radicals (neutral active species) are introduced from a hole formed in the shower plate 13 to the ashing processing room 11 so that the resist mask provided on the processed substrate 24 is removed by the ashing process using the neutral radicals.

Next, the ashing step of the first example of the present invention is discussed with reference to FIG. 11 and FIG. 12.

In a step shown in FIG. 11-(A), an element isolation region 32 is formed in a p-type silicon substrate 31 so that an element forming region is defined. After that, phosphorus (P) ions are implanted in a part of the element forming region so that an n-type well region 33 is formed and boron (B) ions are implanted in other part of the element forming region so that a p-type well region 34 is formed.

In the step of FIG. 11-(A), after a gate dielectric film 35 is formed by applying a thermal oxidation process, gate electrodes 36 and 37 are formed by forming a polysilicon film on an entire surface and by patterning.

Then, in a step of FIG. 11-(B), P ions 39 are implanted into the p-type well region 34 in a state where the n-type well region 33 is covered with the resist mask 38, so that an n-type source/drain region 40 is formed.

A deformed layer 41 due to the implantation of the P ions is formed on a surface of the resist mask 38.

Next, in a step of FIG. 11-(C), for example, 955 sccm of $O_2$ gas, 485 sccm of $N_2$ gas, 15 sccn of $H_2$ gas, and 45 sccm of $CF_4$ gas are introduced. In a state where a pressure of the plasma generation room 12 is kept at approximately 33 Pa (1 Torr), a microwave of 1000 W is introduced so that the plasma is generated. The neutral radicals 42 in this plasma are introduced into the ashing processing room 11. The ashing process is applied in a state where the processed substrate is heated to temperature equal to or less than 130° C. by the stage 21 heated at a temperature equal to or less than 220° C., so that the deformed layer 41 and the resist mask 28 are removed.

Next, in a step of FIG. 12-(A), after the processed substrate is taken out from the ashing processing room 11 via the gate valve 19 to the atmosphere by the arm, a cleaning process using a sulfuric acid water solution is applied to the processed substrate. After that, B ions 44 are implanted into the n-type well region 33 in a state where the p-type well region 34 is covered with the resist mask 43, and thereby a p-type source/drain region 45 is formed.

Next, in a step of FIG. 12-(B), for example, 955 sccm of $O_2$ gas, 485 sccm of $N_2$ gas, 15 sccn of $H_2$ gas, and 45 sccm of $CF_4$ gas are introduced. In a state where a pressure of the plasma generation room 12 is kept at approximately 133 Pa (1 Torr), a microwave of 1000 W is introduced so that the plasma is generated. The neutral radicals 47 in this plasma are introduced to the ashing processing room 11. The ashing process is applied in a state where the processed substrate is heated to a temperature equal to approximately 150° C. by the stage 21 heated at a temperature equal to approximately 250° C., so that the deformed layer 46 and the resist mask 43 are removed. See FIG. 12-(C).

Thus, in the first example of the present invention, since the ashing process based on the P ion implantation is applied at the substrate temperature equal to or less than 130° C., even if the processed substrate is directly taken out to the atmosphere just after the ashing process, the large amount of the Si digging defects is not generated in the n-type source/drain region 40 and polysilicon forming the gate electrode 37.

In the ashing step after the above-discussed ion implantation, it is preferable that the ashing process is applied in a state where heating is applied so that the stage temperature in the step of FIG. 12-(B) is equal to or less than 220° C. and the temperature of the processed substrate is equal to or less than 130° C. Because of this, when the processed substrate is directly taken out to the atmosphere just after the ashing process, the generation of Si digging defect at the n-type source/drain region 40 and the polysilicon forming the gate electrode 37 can be prevented.

In addition, in the case where the ashing process is applied in a state where the surface of the gate electrode 37 or the silicon substrate of the n-type source/drain region 40 where P is implanted, before P ions are activated, it is preferable that heating is applied so that the temperature of the processed substrate at the time of ashing is equal to or less than 130° C. Because of this, the generation of Si digging defect can be further prevented.

SECOND EXAMPLE

Figure 13:
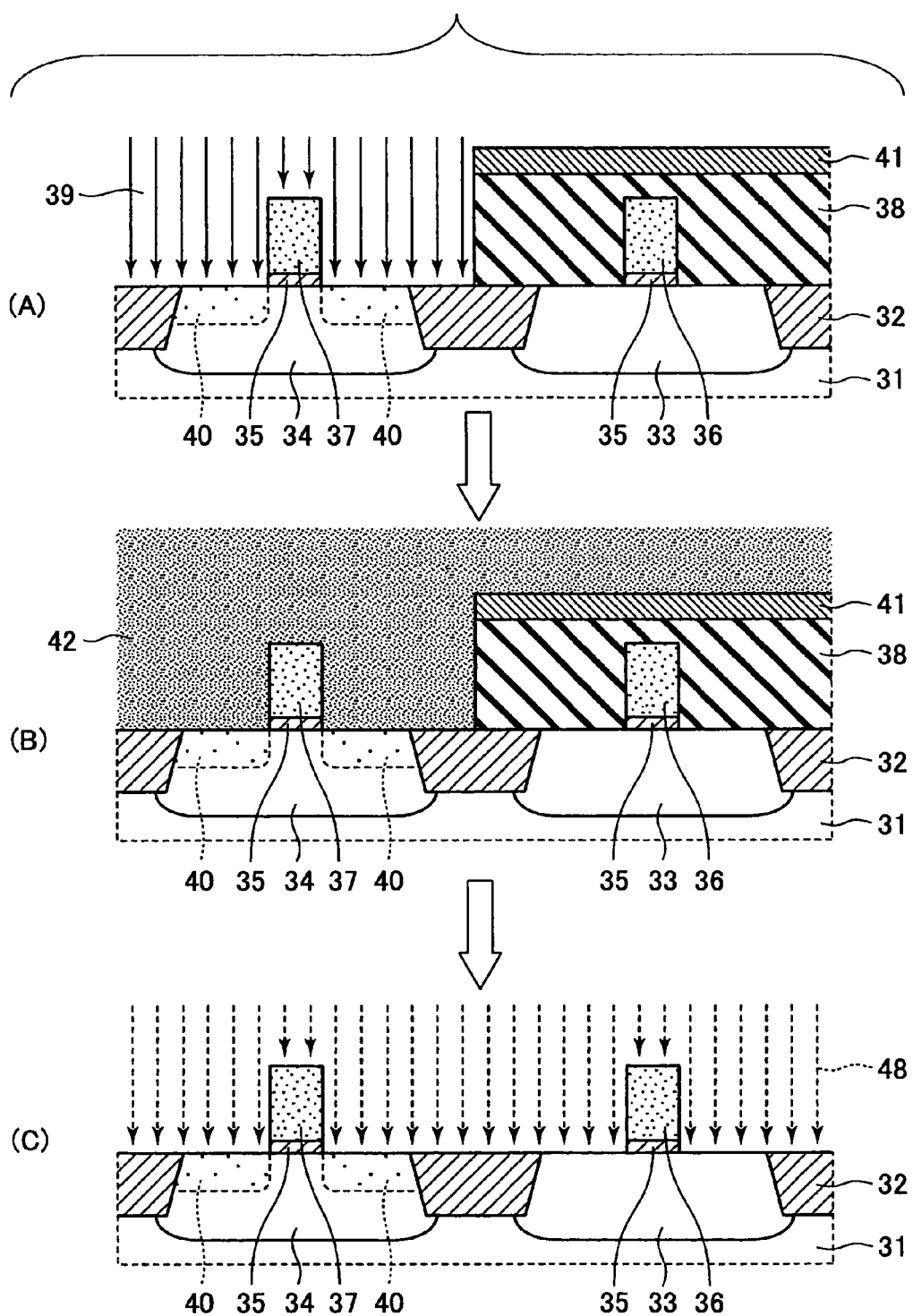
FIG. 13 is a view for explaining an ashing step of a second example of the present invention.

With reference to FIG. 13, an ashing method of the second example of the present invention is discussed. FIG. 13 is a schematic structural view of an ashing processing device used in the second example of the present invention.

Since the ashing process step based on the B ion implantation of the second example is the substantially same as that of the first example, only the ashing process step based on the P ion implantation is discussed.

In a step shown in FIG. 13-(A), an element isolation region 32 is formed in a p-type silicon substrate 31 so that an element forming region is defined. After that, phosphorus (P) ions are implanted in a part of the element forming region so that an n-type well region 33 is formed and boron (B) ions are implanted in other part of the element forming region so that a p-type well region 34 is formed.

In the step of FIG. 13-(A), after a gate dielectric film 35 is formed by applying a thermal oxidation process, gate electrodes 36 and 37 are formed by forming a polysilicon film on an entire surface and by patterning.

Then, P ions 39 are implanted into the p-type well region 34 in a state where the n-type well region 33 is covered with the resist mask 38, so that an n-type source/drain region 40 is formed.

Next, in a step of FIG. 13-(B), for example, 955 sccm of $O_2$ gas, 485 sccm of $N_2$ gas, 15 sccn of $H_2$ gas, and 45 sccm of $CF_4$ gas are introduced. In a state where the pressure of the plasma generation room 12 is kept at approximately 133 Pa (1 Torr), a microwave of 1000 W is introduced so that the plasma is generated. The neutral radicals 42 in this plasma are introduced to the ashing processing room 11. The ashing process is applied in a state where the processed substrate is heated to temperature equal to approximately 150° C. by the stage 21 heated at a temperature equal to approximately 250° C., so that the deformed layer 41 and the resist mask 38 are removed.

Next, in the step of FIG. 13-(C), $N_2$ gas 48 is introduced from the gas supply source 29b into the ashing processing room 11 via the plasma generation room 12 without being made into plasma. The processed substrate is cooled by $N_2$ gas 48 to a temperature equal to or less than 130° C. Then the wafer is taken out from the ashing processing room 11 to the atmosphere via the gate valve 19 by the arm.

After this step, in this second example as well as the first example, the B ions are implanted and the ashing process is applied.

Thus, in the second example of the present invention, after the ashing process is applied at the temperature of approximately 150° C., the processed substrate is cooled by $N_2$ gas 48 to a temperature equal to or less than 130° C. and then taken out from the processing room.

Hence, when the wafer is exposed to the atmosphere, the generation of $H_3PO_4$ is prevented so that the generation of the Si digging defect is prevented. In addition, in this case, forced cooling is applied and therefore, as compared to natural cooling, it is possible to drastically reduce the cooling time.

It is preferable that the processed substrate is cooled at a temperature equal to or less than 130° C. by $N_2$ gas 48, as well as the step of FIG. 13-(C), after the B ions are implanted and the ashing process is applied, and then the processed substrate is taken out to the atmosphere. Because of this, the generation of Si digging defect at the n-type source/drain region 40 and the polysilicon forming the gate electrode 37 can be prevented.

In addition, in the case where the ashing process is applied in a state where the surface of the gate electrode 37 or the silicon substrate of the n-type source/drain region 40 where P is implanted, before P ions are activated, it is preferable that the processed substrate is cooled at the temperature equal to or less than 130° C. by $N_2$ gas 48 and then taken out to the atmosphere. It is also preferable that the temperature of the processed substrate at the time of ashing is equal to or less than 130° C. Because of this, the generation of Si digging defect can be further prevented.

THIRD EXAMPLE

Figure 14:
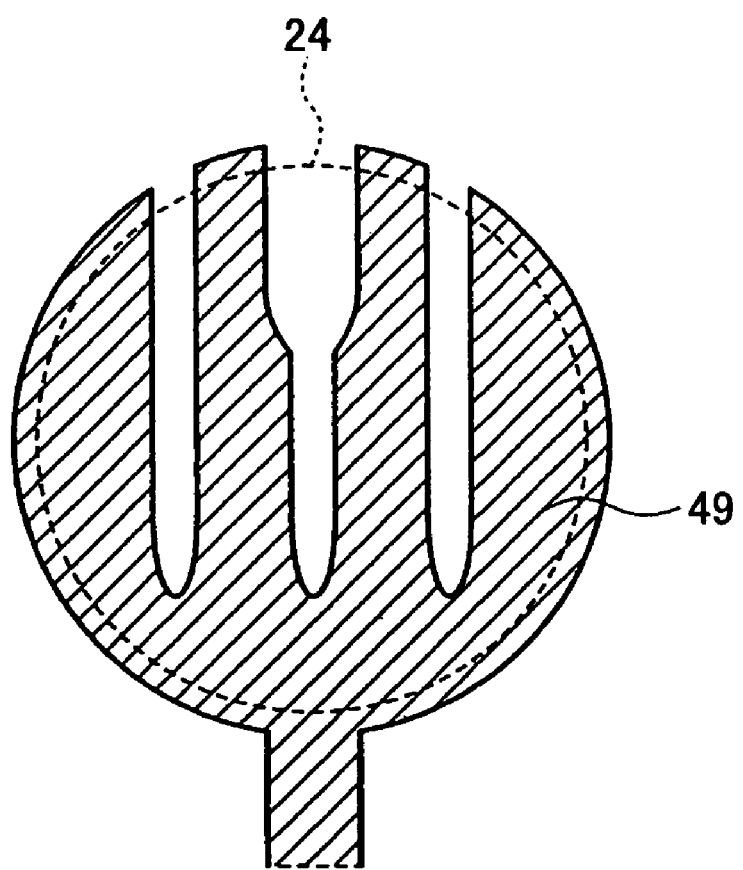
FIG. 14 is a schematic plan view of an arm head end part used in the ashing step of a third example of the present invention.

With reference to FIG. 14, an ashing method of the third example of the present invention is discussed. FIG. 14 is a schematic structural view of an ashing processing device used in the third example of the present invention.

Since the ashing process step based on the B ion implantation of the third example is the substantially same as that of the first example, only the ashing process step based on the P ion implantation is discussed.

Under the same condition as that of the second example, the P ions are implanted and then the ashing process is applied under the same condition as that of the second example. After that, the processed substrate 24 is taken out from the ashing processing room 11 to the atmosphere via the gate valve 19 by the arm 49.

FIG. 14 is a schematic plan view of an arm head end part used in the ashing step of the third example of the present invention. The arm 49 used in this example us larger than a normal arm. The arm 49 in this example come in contact with an area being equal to or greater than three-fourths of a bottom area of the processed substrate. Therefore, the substrate temperature at a part not contacting the arm 49 is decreased so as to be equal to or less than 130° C.

After this step, in this third example as well as the first example, the B ions are implanted and the ashing process is applied.

Thus, the arm having a size larger than an area contacting the processed substrate is used in this example. Hence, even if the ashing process is applied at the temperature of approximately 150° C., when the wafer is taken out to the atmosphere, a special waiting time for cooling is not required and the substrate temperature can be equal to or less than 130° C.

Hence, when the wafer is exposed to the atmosphere, the generation of $H_3PO_4$ is prevented so that the generation of the Si digging defect is prevented.

It is preferable that the processed substrate 24 is taken out to the atmosphere by the arm 49 shown in FIG. 14 after the B ions are implanted and the ashing process is implemented. Because of this, the generation of Si digging defect at the n-type source/drain region 40 and the polysilicon forming the gate electrode 37 can be prevented.

In addition, in the case where the ashing process is applied in a state where the surface of the gate electrode 37 or the silicon substrate of the n-type source/drain region 40 where P is implanted, before P ions are activated, it is preferable that the processed substrate 24 is taken out to the atmosphere by the arm 49 shown in FIG. 14. Because of this, the generation of Si digging defect can be further prevented.

FOURTH EXAMPLE

Figure 15:
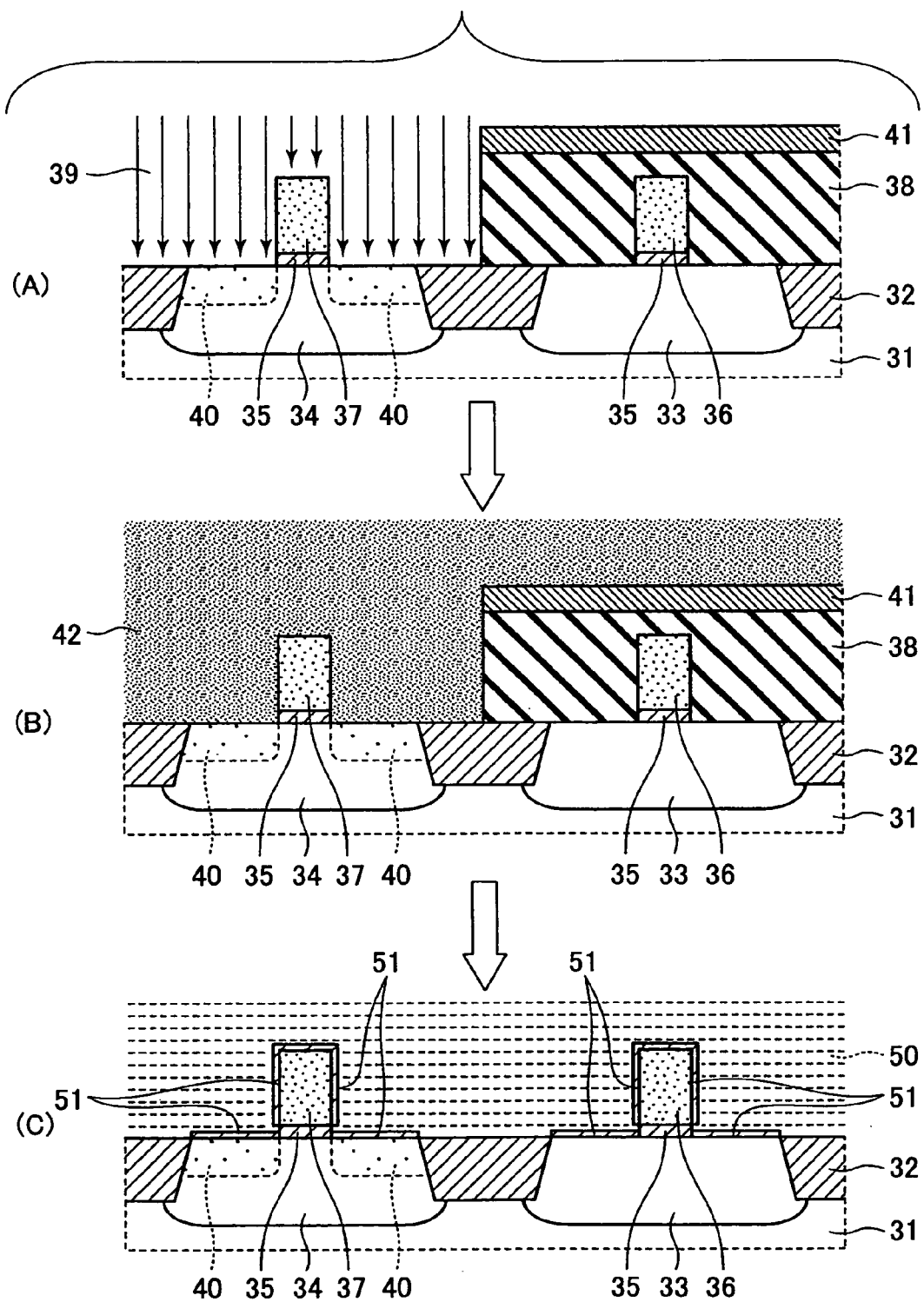
FIG. 15 is a view for explaining an ashing step of a fourth example of the present invention.

With reference to FIG. 15, an ashing method of the fourth example of the present invention is discussed. FIG. 15 is a view for explaining an ashing step of a fourth example of the present invention.

Since the ashing process step based on the B ion implantation of the fourth example is the same as that of the first example, only the ashing process step based on the P ion implantation is discussed.

In the step of FIG. 15-(A), under the same condition as that of the second example, the P ions are implanted and then the ashing process is applied under the same condition as that of the second example so that the resist mask is removed.

Next, in the step of FIG. 15-(C), supply of $N_2$ gas, $H_2$ gas, and $CF_4$ gas is stopped and only $O_2$ gas is supplied, so that oxidization plasma 50 is generated and the shower plate 13 is in a floating state. The oxidization plasma 50 is introduced to the ashing processing room 11. As a result of this, an oxidization film 51 having thickness equal to or greater than 5 nm, for example thickness of approximately 5 nm through 10 nm, is formed on an exposed silicon surface.

Next, after the processed substrate is taken out from the ashing processing room 11 via the gate valve 19 to atmosphere by the arm, a cleaning process using a sulfuric acid water solution is applied to the processed substrate so that the ashing residual is removed and then the HF process is applied so that the oxidization film 51 is removed.

After this step, in this fourth example as well as the first example, the B ions are implanted and the ashing process is applied.

Thus, in the fourth example of the present invention, an additional plasma process is applied to the exposed surface of the processed substrate just after ashing so that the oxidization film 51 is formed. Hence, even if the processed substrate is taken out to the atmosphere at a temperature equal to or higher than 130° C., the P ion implantation regions do not directly contact the atmosphere. Therefore, the generation of $H_3PO_4$ is prevented so that the generation of the Si digging defect is prevented.

The ashing residual and the oxidization film 51 may be removed after the B ions are implanted, the ashing process is applied, the oxidization film 51 is formed on the exposed silicon surface by the oxidization plasma 50, as well as the step of FIG. 15-(C), and the processed substrate is taken out to the atmosphere. Because of this, the generation of Si digging defect at the n-type source/drain region 40 and the polysilicon forming the gate electrode 37 can be prevented.

In addition, in the case where the ashing process is applied in a state where the surface of the gate electrode 37 or the silicon substrate of the n-type source/drain region 40 where P is implanted, before P ions are activated, it is preferable that the step of FIG. 15-(C) is applied and the oxidization film 51 is removed. Because of this, the generation of Si digging defect can be further prevented.

FIFTH EXAMPLE

Figure 16:
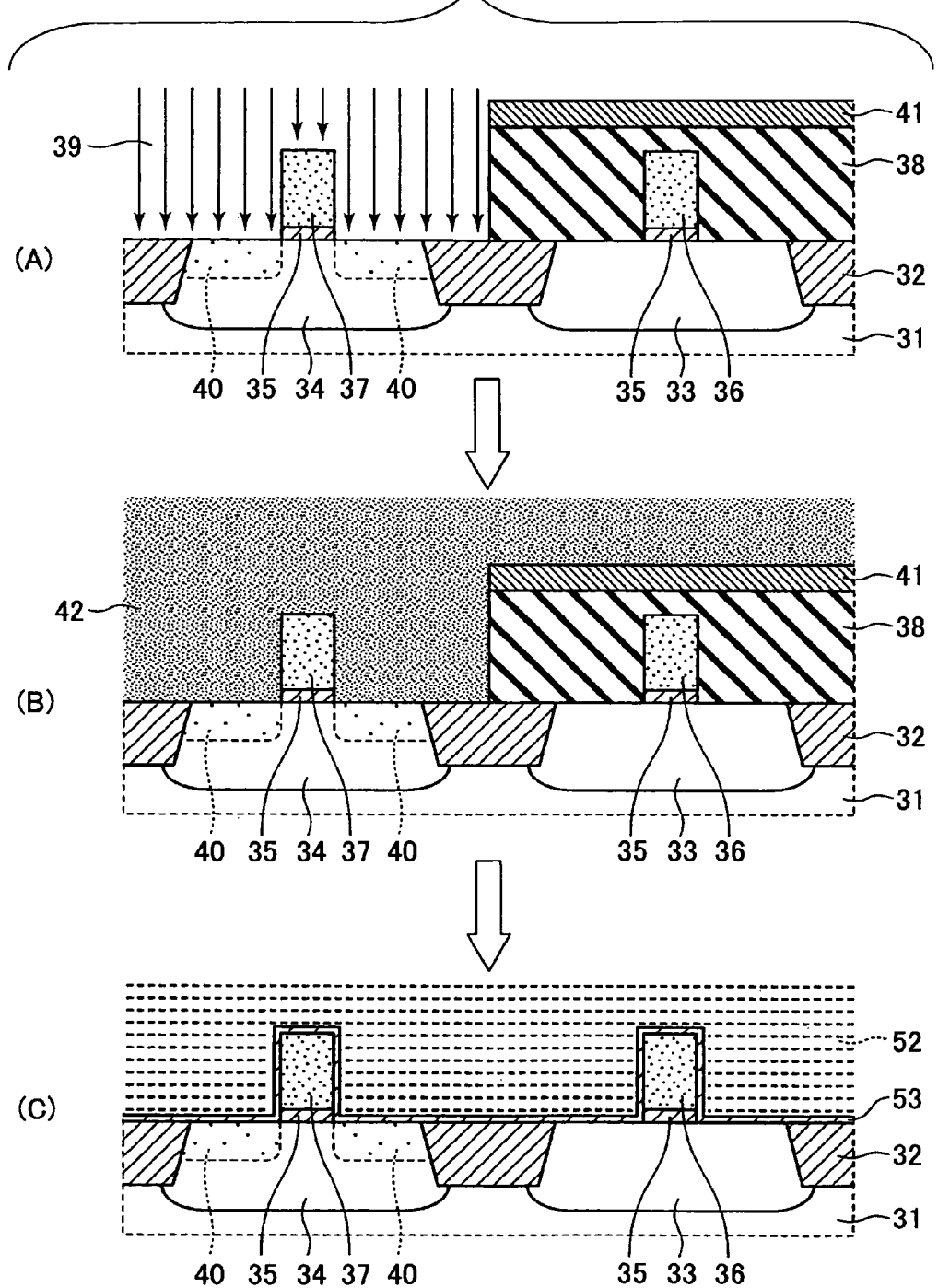
FIG. 16 is a view for explaining an ashing step of a fifth example of the present invention.

With reference to FIG. 16, an ashing method of the fifth example of the present invention is discussed. FIG. 16 is a view for explaining an ashing step of a fifth example of the present invention.

Since the ashing process step based on the B ion implantation of the fifth example is substantially the same as that of the first example, only the ashing process step based on the P ion implantation is discussed.

In the step of FIG. 16-(A), under the same condition as that of the second example, the P ions are implanted and then, in the step of FIG. 16-(B), the ashing process is applied under the same condition as that of the second example so that the resist mask is removed.

Next, in the step of FIG. 16-(C), supply Of $O_2$ gas and $N_2$ gas is stopped and $H_2$ gas and $CF_4$ gas are supplied, so that mixture plasma 52 of C and F is generated and the shower plate 13 is in a floating state. The mixture plasma 52 is introduced to the ashing processing room 11. As a result of this, a mixture film 51 of C and F having thickness equal to or greater than 5 nm, for example thickness of approximately 5 nm through 10 nm, is formed on an exposed silicon surface.

Next, after the step of FIG. 16-(C) is implemented and the processed substrate is taken out from the ashing processing room 11 via the gate valve 19 to the atmosphere by the arm, a cleaning process using a sulfuric acid water solution is applied to the processed substrate so that the ashing residual is removed. At this time, a mixture film 53 is dissolved in the sulfuric acid water so as to be removed concurrently.

After this step, in this second example as well as the first example, the B ions are implanted and the ashing process is applied.

Thus, in the fifth example of the present invention, an additional plasma process is applied to the exposed surfaced of the processed substrate just after ashing so that the mixture film 53 of C and F is formed. Hence, even if the processed substrate is taken out to the atmosphere at a temperature equal to or higher than 130° C., the P ion implantation regions do not directly contact the atmosphere. Therefore, the generation of $H_3PO_4$ is prevented so that the generation of the Si digging defects is prevented.

The ashing residual and the mixture film 53 may be removed after the B ions are implanted, the ashing process is applied, the mixture film 53 of carbon and fluoride is formed, as well as the step of FIG. 16-(C), and the processed substrate is taken out to the atmosphere. Because of this, the generation of Si digging defect at the n-type source/drain region 40 and the polysilicon forming the gate electrode 37 can be prevented.

In addition, in the case where the ashing process is applied in a state where the surface of the gate electrode 37 or the silicon substrate of the n-type source/drain region 40 where P is implanted, before P ions are activated, it is preferable that the step of FIG. 16-(C) is applied and the ashing residual and the mixture film 53 are removed. Because of this, the generation of Si digging defect can be further prevented.

SIXTH EXAMPLE

Figure 17:
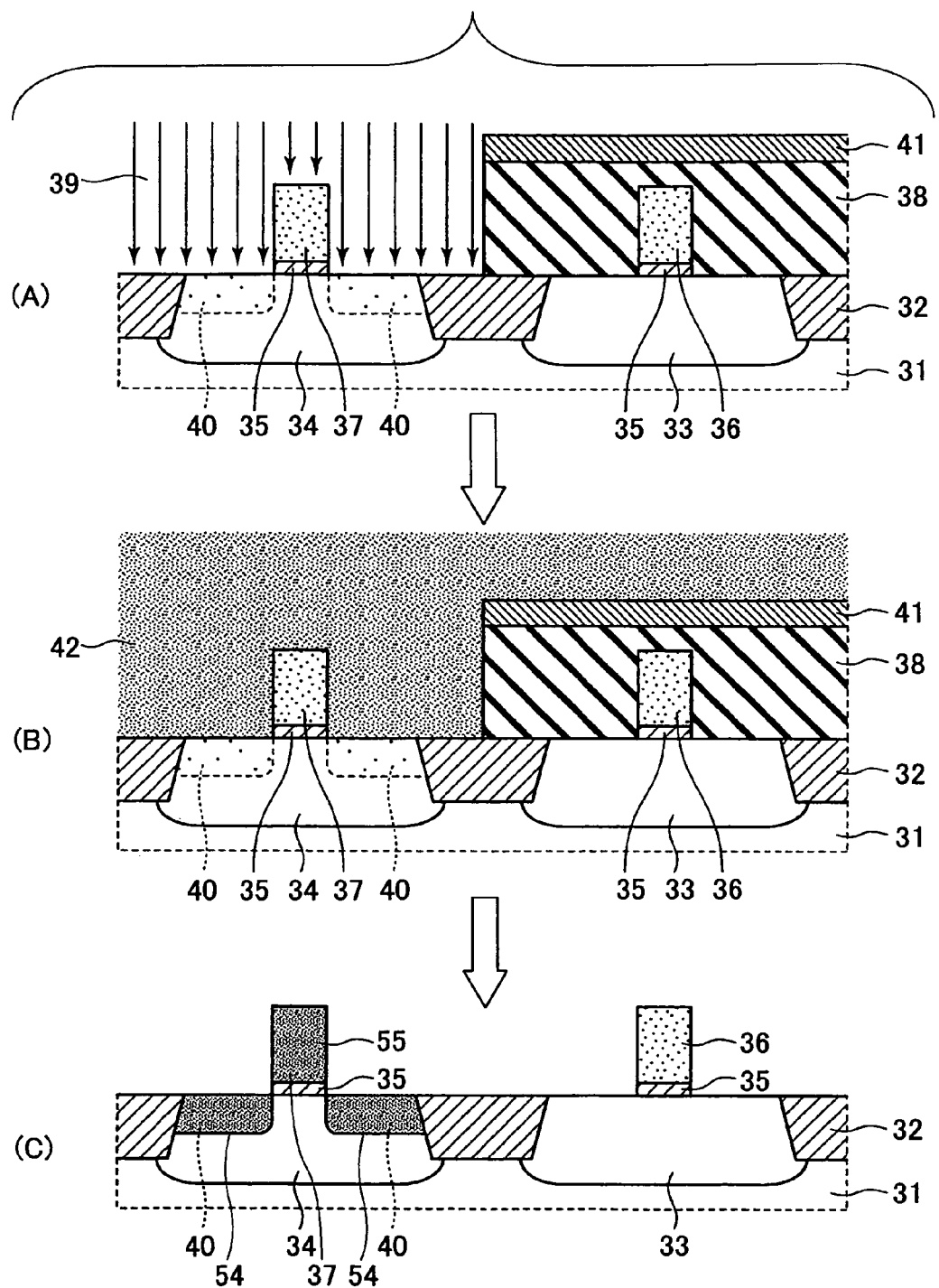
FIG. 17 is a view for explaining an ashing step of a sixth example of the present invention.

With reference to FIG. 17, an ashing method of the sixth example of the present invention is discussed. FIG. 17 is a view for explaining an ashing step of the sixth example of the present invention.

Since the ashing process step based on the B ion implantation of the sixth example is the same as that of the first example, only the ashing process step based on the P ion implantation is discussed.

In the step of FIG. 17-(A), under the same condition as that of the second example, the P ions are implanted and then, in the step of FIG. 17-(B), the ashing process is applied under the same condition as that of the second example so that the resist mask is removed.

Next, the processed substrate is carried in a neighboring annealing device via the gate valve (not shown) and then the thermal process at high temperature is applied so that the implanted P ions are activated.

After this step, in this sixth example as well as the first example, the B ions are implanted and the ashing process is applied.

Thus, in the sixth example of the present invention, the thermal process is applied without exposure to the atmosphere just after the ashing process so that the P ions are implanted. The P ions are activated and arranged in positions of the silicon crystal lattice. Hence, reactivity with hydrogen or oxygen is reduced. Hence, even if the P activation regions 54 and 55 directly contact the atmosphere, $H_3PO_4$ that may cause the generation of the Si digging defects is not generated. As a result of this, generation of the Si digging defects can be prevented.

SEVENTH EXAMPLE

Figure 18:
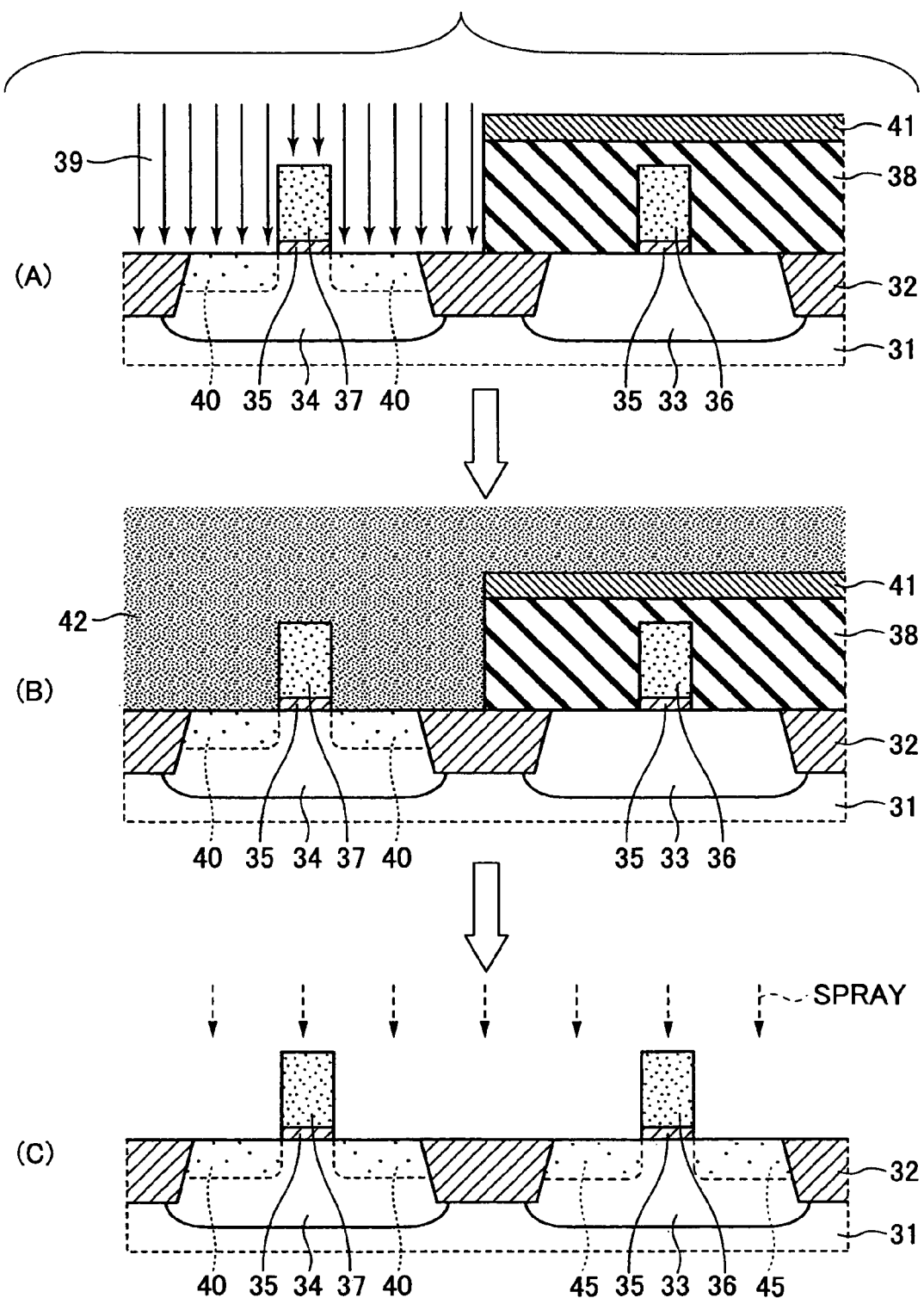
FIG. 18 is a view for explaining an ashing step of a seventh example of the present invention.
Figure 19:
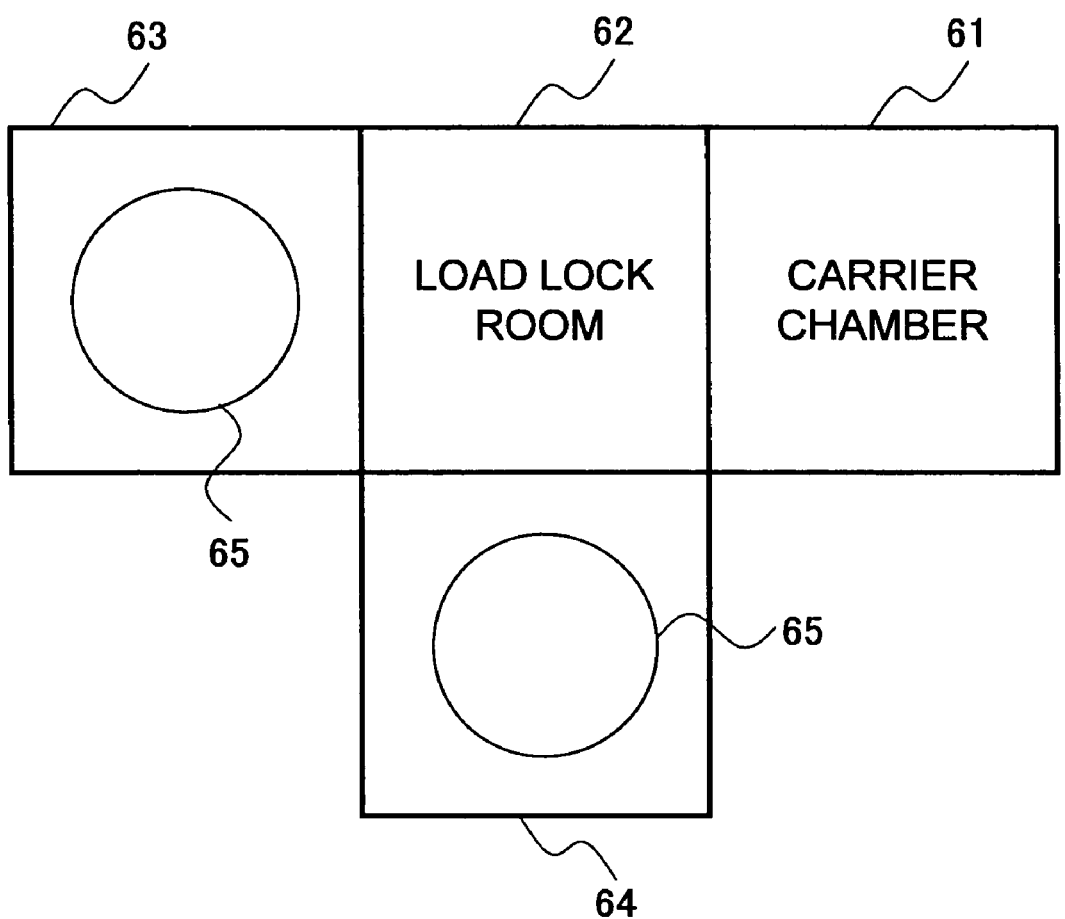
FIG. 19 is a schematic plane view of an ashing processing device in an ashing step of a seventh example of the present invention.

With reference to FIG. 18 and FIG. 19, an ashing method of the seventh example of the present invention is discussed. FIG. 18 is a view for explaining an ashing step of the seventh example of the present invention. FIG. 19 is a schematic plan view of an ashing processing device in an ashing step of the seventh example of the present invention.

Since the ashing process step based on the B ion implantation of the seventh example is substantially the same as that of the first example, only the ashing process step based on the P ion implantation is discussed.

In the step of FIG. 18-(A), after a gate dielectric film 35 is formed by applying a thermal oxidation process, gate electrodes 36 and 37 are formed by forming a polysilicon film on an entire surface and by patterning.

Then, P ions 39 having dose amounts of $6\times10^{15}$ $cm^{-2}$ are implanted into the p-type well region 34 by using the gate electrode 37 as the mask in a state where the n-type well region 33 is covered with the resist mask 38, so that an n-type source/drain region 40 is formed.

Next, in a step of FIG. 18-(B), for example, 955 sccm of $O_2$ gas, 485 sccm of $N_2$ gas, 15 sccn of $H_2$ gas, and 45 sccm of $CF_4$ gas are introduced. In a state where the pressure of the plasma generation room 12 is kept at approximately 133 Pa (1 Torr), a microwave of 1000 W is introduced so that the plasma is generated. The neutral radical 42 in this plasma are introduced to the ashing processing room 11. The ashing process is applied in a state where the processed substrate is heated to temperature equal to approximately 150° C. by the stage 21 heated at a temperature equal to approximately 250° C., so that the deformed layer 41 and the resist mask 38 are removed.

Next, in the step of FIG. 18-(C), the substrate 65 is carried from the ashing process room 63 shown in FIG. 19 to the surface processing room 64 in a vacuum state via the gate valve (not shown) and the load lock room 62.

Furthermore, in the step of FIG. 18-(C), inactive gas such as $N_2$, Ar, He, Ne, or the like is introduced into the surface processing room 64 so that the inside of the surface processing room 64 has a normal pressure. In addition, an organic solvent such as HMDS (Hexamethyldisioxane) or TMCTS (Tetramethylcyclotetrasiloxane) or an inorganic solvent such as ammonium fluoride ($NH_4F$) is sprayed onto the surface of the substrate 65 by a spraying method. The spraying speed may be, for example, 0.1 liter per minute through 1 liter per minute. As a result of this, the surface of the gate electrode 37 and the silicon substrate of the n-type source/drain region where P is implanted is made water-repellent, and thereby moisture may not be adhered to the surface of the substrate. Therefore, when the substrate is taken out to the atmosphere after this step, the generation of $H_3PO_4$ is prevented so that the generation of the Si digging defect is prevented.

In addition, due to evaporation of the organic solvent or inorganic solvent from the substrate surface, the temperature of the substrate is decreased by evaporation heat to a temperature equal to or less than 130° C. and thereby the generation of the Si digging defect is further prevented.

When the inactive gas is introduced, the inactive gas may be sprayed onto the substrate 65. As a result of this, since the substrate temperature at the time of starting spraying the organic solvent can be decreased, the amount of the organic solvent used can be reduced and a selective area of the organic solvent use can be widened.

Next, after the step of FIG. 18-(C) is implemented and the substrate 65 is taken out from the surface processing room 64 to the atmosphere, a cleaning process using a sulfuric acid water solution is applied to the substrate so that the ashing residual is removed. At this time, the surface of the processed substrate is cleaned.

Then, implantation of B ions and the ashing process are implemented. More specifically, the implantation of the B ions is implemented in the same way as that of the first example and then the same step as the step of FIG. 18-(C) is implemented.

Thus, in the seventh example of the present invention, after the ashing process, the organic solvent or inorganic solvent is sprayed onto the substrate surface. Therefore, the surface of the gate electrode 37 and the silicon substrate of the n-type source/drain region where P ions are implanted is made water-repellent. Since the substrate is taken out to the atmosphere after the conversion to water repellency, the moisture is not adhered and the generation of the $H_3PO_4$ is prevented. As a result of this, the generation of the Si digging defects on the surface of the gate electrode 37 and the silicon substrate of the n-type source/drain region is prevented. In addition, since the substrate is cooled by evaporation of the organic solvent or inorganic solvent, the substrate temperature at the time the substrate is taken out to the atmosphere is decreased. Hence, the generation of the Si digging defects is further prevented.

EIGHTH EXAMPLE

Figure 20:
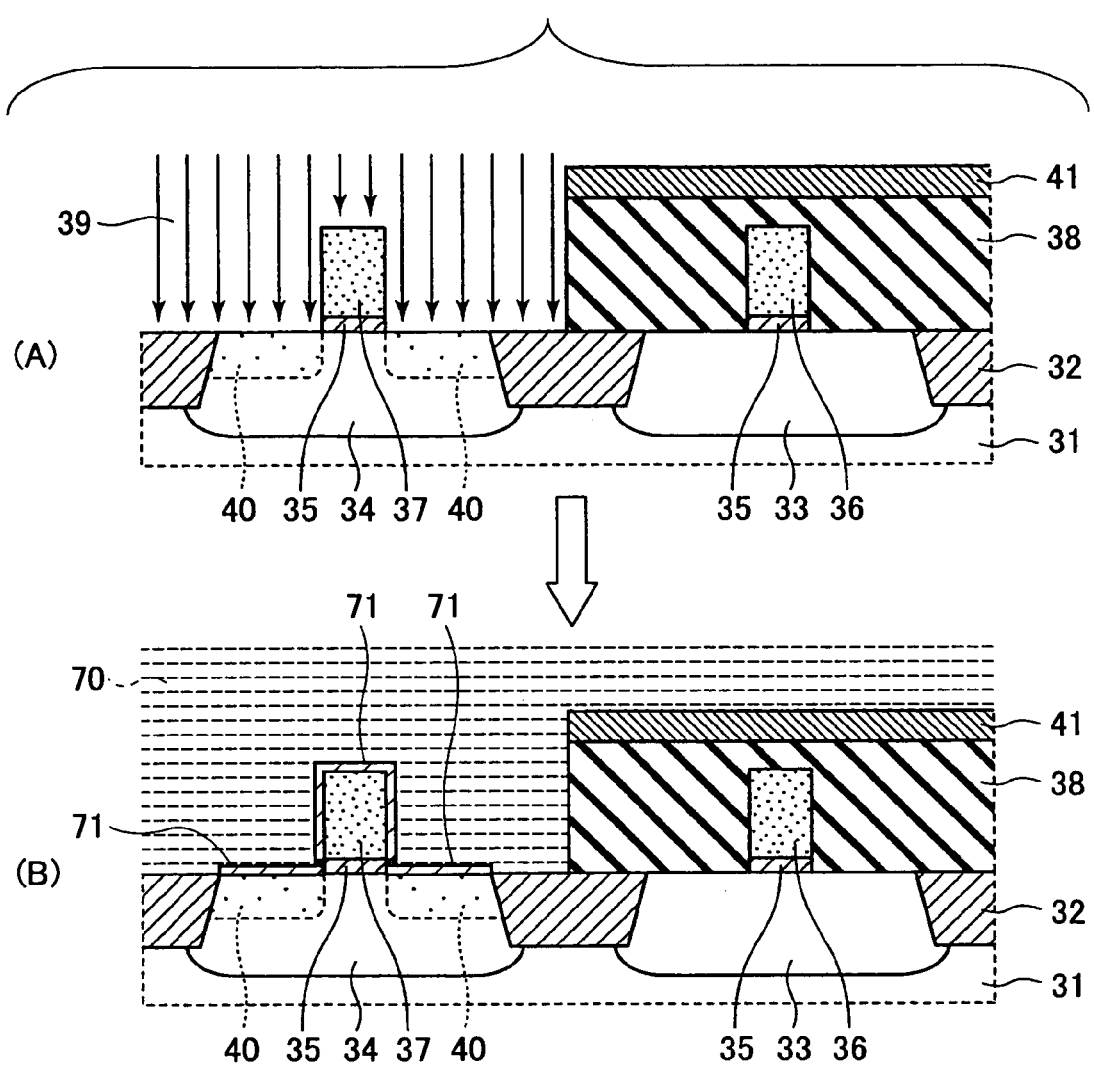
FIG. 20 is a view for explaining an ashing step of an eighth example of the present invention.

With reference to FIG. 20, an ashing method of the eighth example of the present invention is discussed. FIG. 20 is a view for explaining an ashing step of the eighth example of the present invention.

Since the ashing process step based on the B ion implantation of the eighth example is substantially the same as that of the first example, only the ashing process step based on the P ion implantation is discussed.

In the step of FIG. 20-(A) as well as the step of FIG. 18-(A) in the seventh example of the present invention, patterned gate dielectric film 35 and gate electrodes 36 and 37 are formed. In addition, P ions 39 having dose amount of $6 \times 10^{15}$ $cm^{-2}$ are implanted into the P-type well region 34 by using the gate electrode 37 as the mask so that the n-type source/drain region 40 is formed.

Next, in the step of FIG. 20-(B), the ashing process and a process for forming the oxidization film covering the surface of the electrode 37 and the silicon substrate of the p-type well region 34 are implemented concurrently.

In the process for performing the ashing process and forming the oxidization film 71, for example, 1000 sccm of $O_2$ gas is introduced. In a state where the pressure of the plasma generation room 12 is kept at approximately 133 Pa (1 Torr), a microwave of 1000 W is introduced so that the plasma is generated. The neutral radicals 70 in this plasma are introduced to the ashing processing room 11.

Furthermore, the processed substrate is heated to a temperature range of approximately 100° C. through 500° C., for example, approximately 400° C., the deformed layer 41 and the resist mask 38 are removed, and the oxidization film 71 having thickness equal to or greater than 5 nm, for example thickness of approximately 5 nm through 10 nm, is formed on the surface of the electrode 37 and the silicon substrate of the n-type source/drain region 40. If the heating temperature of the processed substrate is less than 100° C., the ashing reaction may not be generated. If the heating temperature of the processed substrate is higher than 500° C., a time for cooling the processed substrate is too much.

After the step of FIG. 20-(B), the processed substrate is taken out from the ashing processing room 11 via the gate valve 19 to the atmosphere, and then a cleaning process using a sulfuric acid water solution is applied to the processed substrate so that the ashing residual is removed and then the HF process is applied so that the oxidization film 71 is removed.

After this step, the B ions are implanted and the ashing process is applied.

More specifically, the implantation of the B ions is implemented in the same way as that of the first example and then the same step as the step of FIG. 20-(B) is implemented.

Thus, in the eighth example of the present invention, the oxidization film 71 is formed on the surface of the gate electrode 37 and the silicon substrate of the n-type source/drain region 40 where P is implanted at the same time of the ashing process, and then the substrate is taken out to the atmosphere. Hence, the surface of the gate electrode 37 and the surface of the silicon substrate of the n-type source/drain region 40 can be protected, and thereby the generation of the Si digging defects can be prevented.

NINTH EXAMPLE

The inventor of the present invention found that, in a case of a 300 mm substrate, the number of Si digging defects per a single substrate is increased due to the large size of the substrate.

Figure 21:
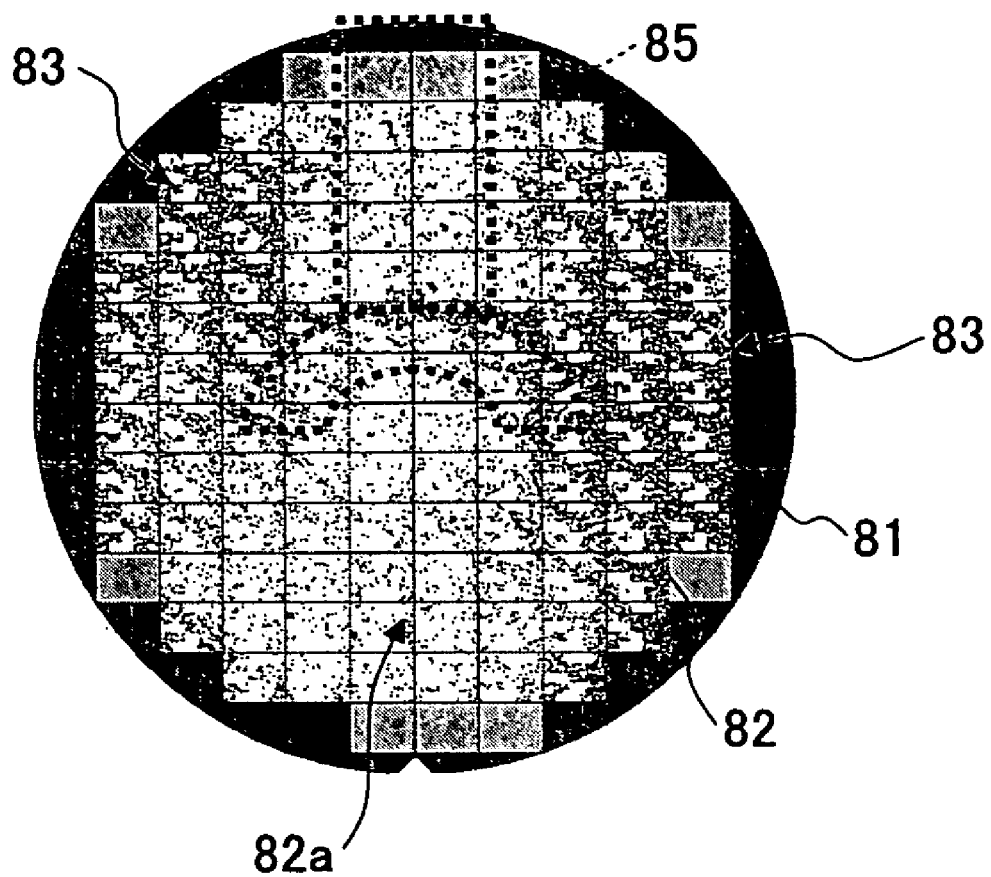
FIG. 21 is a view for explaining distribution of a Si digging defect at a 300 mm substrate.

FIG. 21 is a view for explaining distribution of the Si digging defect on the 300 mm substrate.

More specifically, FIG. 21 shows the distribution of the Si digging defects of the 300 mm substrate 81 in a case where the substrate 81 is taken out to the atmosphere by the arm 85 just after the implantation of P ions having dose amount of $6 \times 10^{15}$ cm$^{-2}$ of the first example as shown in FIG. 9 is implemented and the ashing process where the stage temperature is approximately 300° C. is applied.

The Si digging defects 83 shown by dots in FIG. 21 are generated at parts of the chip 81 not contacting the arm 85. On the other hand, the number of the Si digging defects at parts of the chip 81 contacting the arm 85 is small.

It looks like the number of the Si digging defects 3 on the chip 81 at the lower side of the arm 85 in FIG. 21 is small. This is because a measuring device stops measurement due to overflow and actually a large number of the Si digging defects are generated. Such a distribution of the Si digging defect is substantially the same as the distribution shown in FIG. 7.

Figure 22:
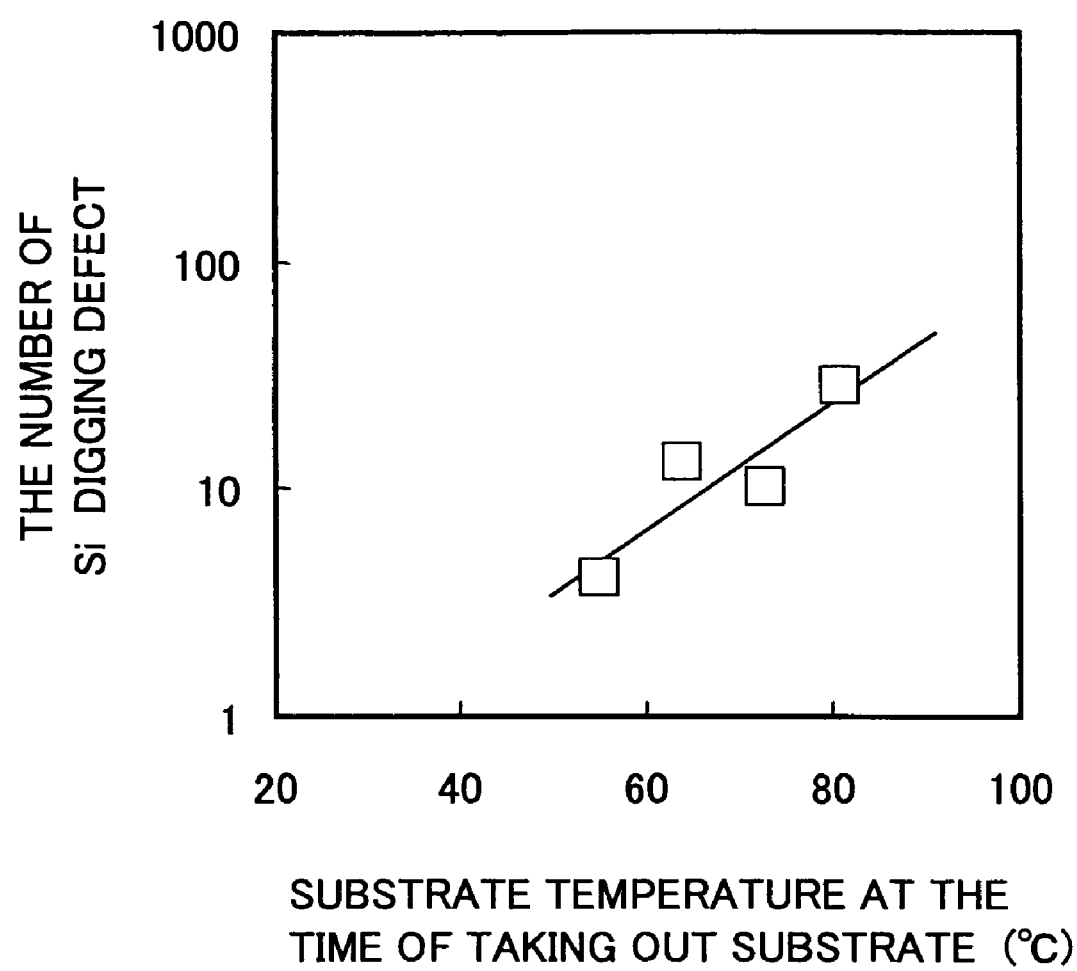
FIG. 22 is a graph showing a relationship between the number of the Si digging defects at the 300 mm substrate and a substrate temperature when the 300 mm substrate is taken out.

FIG. 22 is a graph showing a relationship between the number of the Si digging defects on the 300 mm substrate and the substrate temperature when the 300 mm substrate is taken out.

Referring to FIG. 22, in a case where the substrate temperature at the time of taking out the 300 mm substrate is approximately 80° C., several tens of the Si digging defect are generated per a single substrate. Such a generation of the Si digging defects may cause undesirable etching of the polysilicon layer of the source/drain region of a CMOS transistor. Therefore, this may cause reduction of the driving electrical current due to the increase of sheet resistance of the source/drain or increase of unevenness of the driving current so that the transistor characteristic may be degraded.

Accordingly, the inventor of the present invention provides the ninth example of the present invention so that the generation of the Si digging defects after the ashing process of the substrate where P ions having high dose amounts equal to or greater than $5 \times 10^{15}$ cm$^{-2}$, more specifically dose amounts of equal to or greater than $6 \times 10^{15}$ cm$^{-2}$ is further reduced.

In the ninth example of the present invention, after the ashing process based on the implantation of P ions, the protection film covering the surface of the gate electrode or the silicon substrate where P is implanted is formed. The generation of $H_3PO_4$ is prevented by the protection film so that the generation of the Si digging defects is prevented.

The manufacturing method of the semiconductor device of the ninth example of the present invention is discussed with reference to FIG. 23-(A) through FIG. 25-(C).

Figure 23:
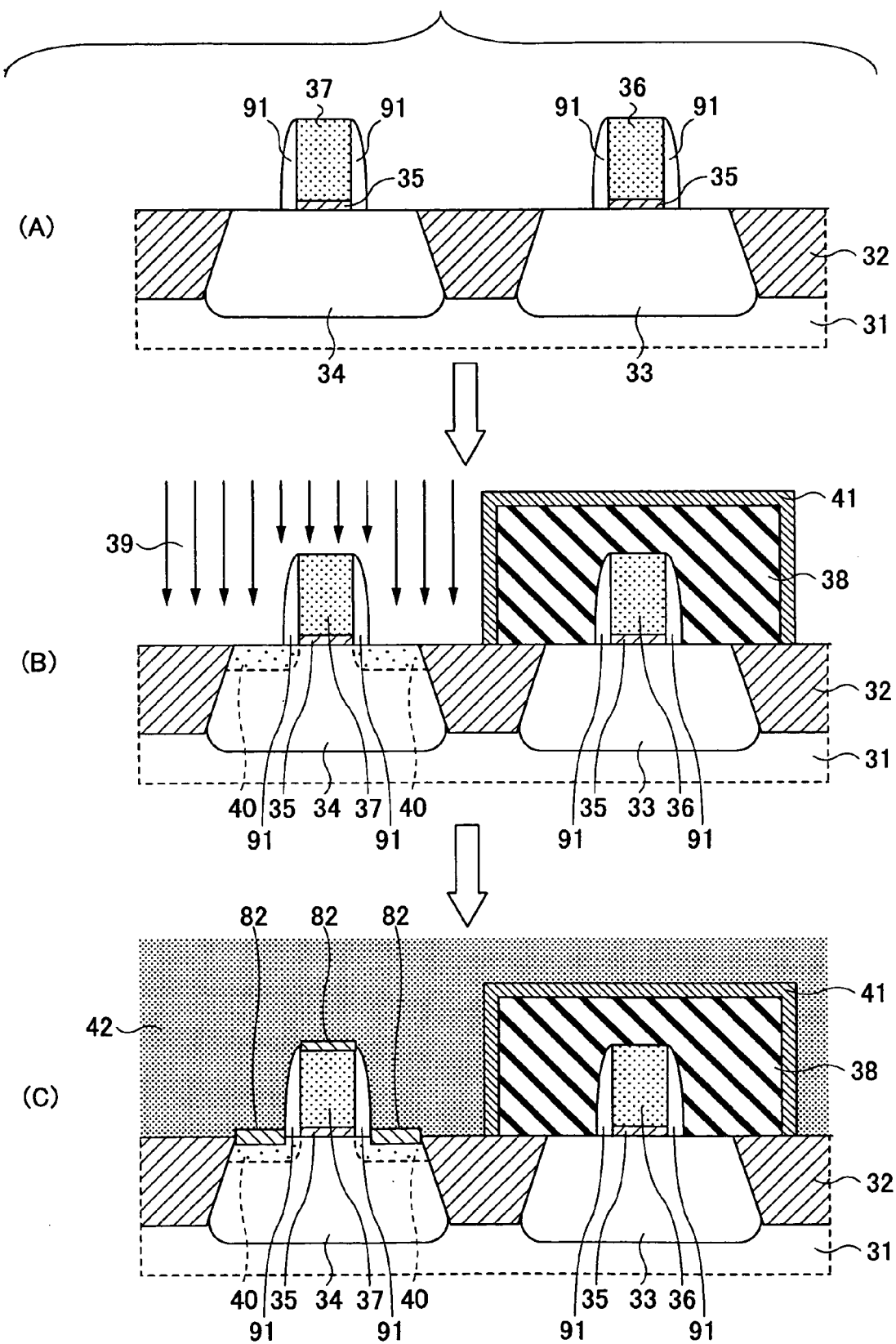
FIG. 23 is a first view for explaining an ashing step of a ninth example of the present invention.
Figure 24:
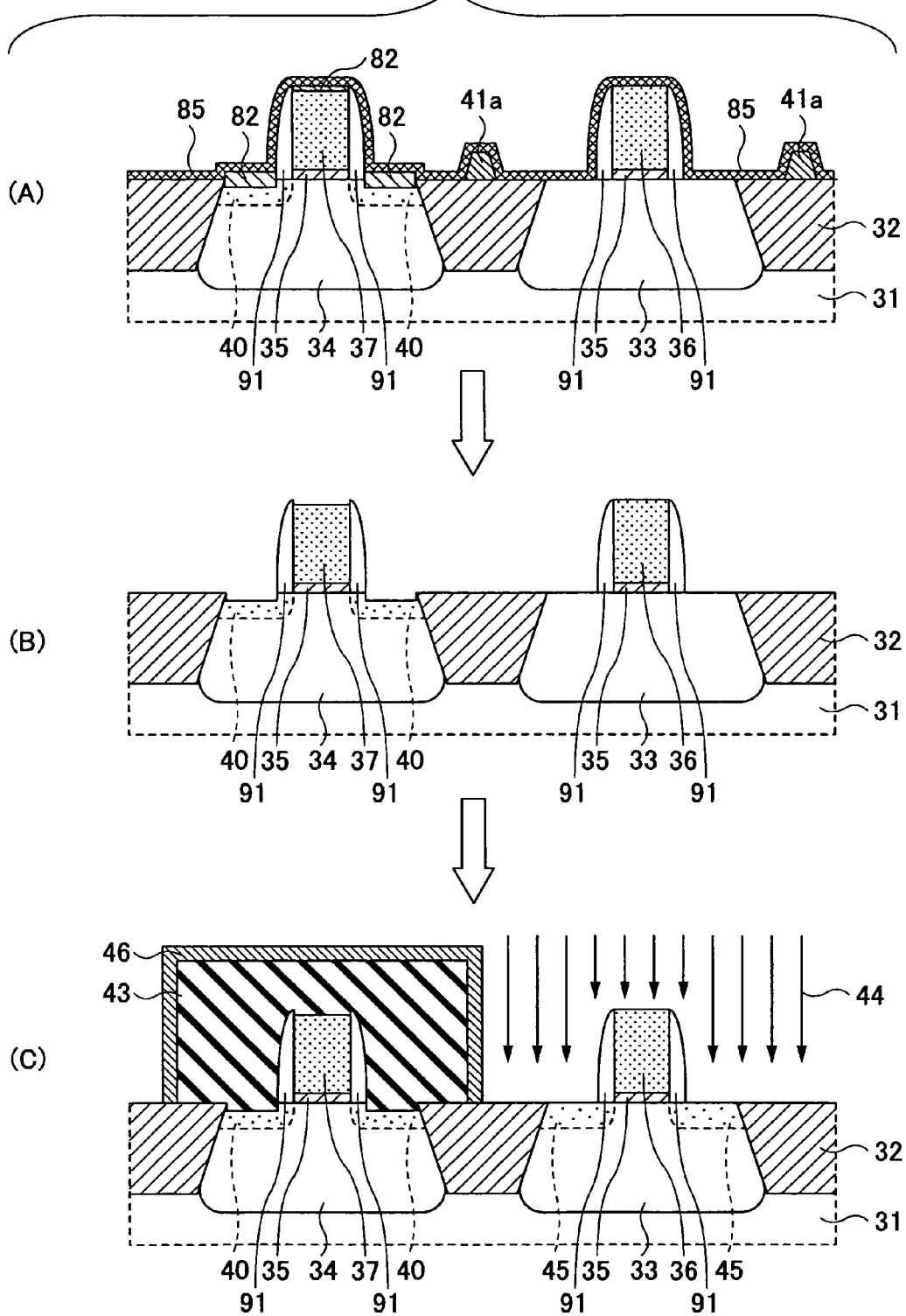
FIG. 24 is a second view for explaining an ashing step of a ninth example of the present invention.

FIG. 23 is a first view for explaining an ashing step of a ninth example of the present invention. FIG. 24 is a second view for explaining an ashing step of a ninth example of the present invention. FIG. 25 is a third view for explaining an ashing step of a ninth example of the present invention. In FIG. 23 through FIG. 25, parts that are the same as the parts discussed above are given the same reference numerals, and explanation thereof is omitted.

In a step shown in FIG. 23-(A), an element isolation region 32 is formed in a p-type silicon substrate 31 so that an element forming region is defined. After that, phosphorus (P) ions are implanted in a part of the element forming region so that an n-type well region 33 is formed and boron (B) ions are implanted in other part of the element forming region so that a p-type well region 34 is formed.

In the step of FIG. 23-(A), after a gate dielectric film 35 is formed by applying a thermal oxidation process, gate electrodes 36 and 37 are formed by forming a polysilicon film on an entire surface and by patterning.

In the step of FIG. 23-(A), a dielectric film covering the surface of the silicon substrate and the gate electrodes 36 and 37, such as the silicon oxide film or silicon nitride film, is formed and a side wall dielectric film 91 covering a side wall surface of the gate dielectric film 35 and the gate electrodes 36 and 37 are formed by a etch-back process.

In a step of FIG. 23-(B), the n-type source/drain region 40 is formed in the p-type well region 34. More specifically, in a state where the n-type well region 33 is covered with the resist mask 38, the n-type source/drain region 40 is formed by using the side wall dielectric film 91 and the gate electrode 37 as a mask and by implanting the P ions 39 having dose amount of $6 \times 10^{15}$ cm$^{-2}$ into the p-type well region 34. At the time of implanting the P ions, the deformed layer 41 is formed on the surface of the resist mask 38.

Next, in a step of FIG. 23-(C), for example, the deformed layer 41 and the resist mask 38 are removed by the ashing process. More specifically, a microwave type ashing processing device shown in FIG. 10 is used.

For example, 3500 sccm of $O_2$ gas and 35 sccm of $CF_4$ gas are introduced. In a state where the pressure of the plasma generation room 12 is kept at approximately 133 Pa (1 Torr), a microwave of 1000 W is introduced so that the plasma is generated. Positive ions and electrodes in the plasma are removed and the neutral radicals 42 in this plasma are introduced to the ashing processing room 11. The ashing process is applied in a state where the processed substrate is heated to a temperature of approximately 250° C., so that the deformed layer 41 and the resist mask 38 are removed.

The ashing process may be implemented during a period approximately 1.5 through 2 times a period from start of the process to completion of removal of the deformed layer 41 and the resist mask 38. As a result of this, the deformed layer 41 and the resist mask 38 are completely removed.

For example, 500 sccm of $N_2$ gas and 500 sccm of $H_2$ gas may be used as process gas for the ashing process and the environment may be a vacuum environment of 133 Pa (1 Torr).

In the step of FIG. 24-(A), while the vacuum environment is kept, by using a Chemical Vapor Deposition (CVD) method, the protection film 85 is formed so as to cover the surface of a structural body where the resist mask 38 and the deformed layer 41 of FIG. 23-(C) are removed. The protection film 85 is made of a material selected from a group consisting of the silicon substrate, polysilicon, and a material having an etching selectivity with the side wall insulating film 91. In a case where the protection film 85 is made of a silicon oxidization film, the protection film 85 is formed so as to have thickness of, for example, 2 nm through 5 nm, by introducing, for example, 1000 sccm of $SiH_4$ gas and 2000 sccm of $N_2O$ gas to a deposition room of a vacuum CVD device, heating the substrate to 400° C. under the vacuum environment of 3 Torr, and applying RF power (2 KW, for example) at 13.56 MHz.

As a process gas forming the silicon oxidization film, instead of silane group gas such as $SiH_4$ gas, tetraethylorthosilicate (TEOS), or the like may be used. Alternatively, hydrocarbon group gas selected from a group consisting of $CH_4$ gas, $C_2H_2$ gas, $C_2H_4$ gas, and $C_2H_6$ gas may be used. Since the silane group gas and hydrocarbon gas do not attack silicon, it is possible to avoid the attack on the gate electrode or the source/drain region. As a result of this, it is possible to avoid the increase of the sheet resistance of the source/drain region 40.

In addition, as the process gas forming the silicon oxidization film, fluoride group gas selected from a group consisting of $CH_3F$ gas, $CH_2F_2$ gas and $CHF_3$ gas may be used. In the case where the fluoride group gas is used, plasma density should be controlled so that excessive generation of fluoride radicals is prevented. As a result of this, it is possible to avoid excessive etching by the fluoride radicals of the silicon substrate and the gate electrode. In addition, in the step of FIG. 23-(C), undesirable residual 41a may stay behind. Although the protection film 85 is formed on the residual 41a in this step, the residual 41a can be removed in a next step.

In the step of FIG. 24-(A), the substrate is taken out from the deposition room to the atmosphere. The gate electrode 37 and the n-type source/drain region 40 where the P ions having dose amount of $6 \times 10^{15}$ cm$^{-2}$ are implanted are covered with the protection film 85. Therefore, even if the temperature of the substrate is approximately 80° C. or higher, since P in the gate electrode 37 and the n-type source/drain region 40 do not come in contact with the moisture in the atmosphere, the generation of $H_3PO_4$ is prevented so that the generation of the Si digging defect is prevented. In addition, since the substrate can be taken out to the atmosphere before the temperature of the substrate is decreased, it is possible to prevent the decrease of throughput generated due to addition of the protection forming step.

Next, in step of FIG. 24-(B), the protection film 85, the oxidization film 82 and the residual 41a can be removed.

In the case where the protection film 85 is a silicon oxidization film, a cleaning process using a sulfuric acid water solution or ammonia water solution is applied to the substrate so that the silicon oxidization film and the ashing residual are removed. The oxidization film 82 is removed by the ashing step from the surface of the gate electrode 37 and the n-type source/drain region 40. Hence, although a concavity of approximately 1 nm through 2 nm is formed, the concavity is minute and does not cause an increase of the sheet resistance of the source/drain.

Next, in the step of FIG. 24-(C), in a state where the p-type well region 34 is covered with the resist mask 43, B ions 44 are implanted into the n-type well region 33 so that the p-type source/drain region 45 is formed. When the ion implantation is implemented, the deformed layer 46 based on the implantation of B ion on the surface of the resist mask 43 is formed.

Figure 25:
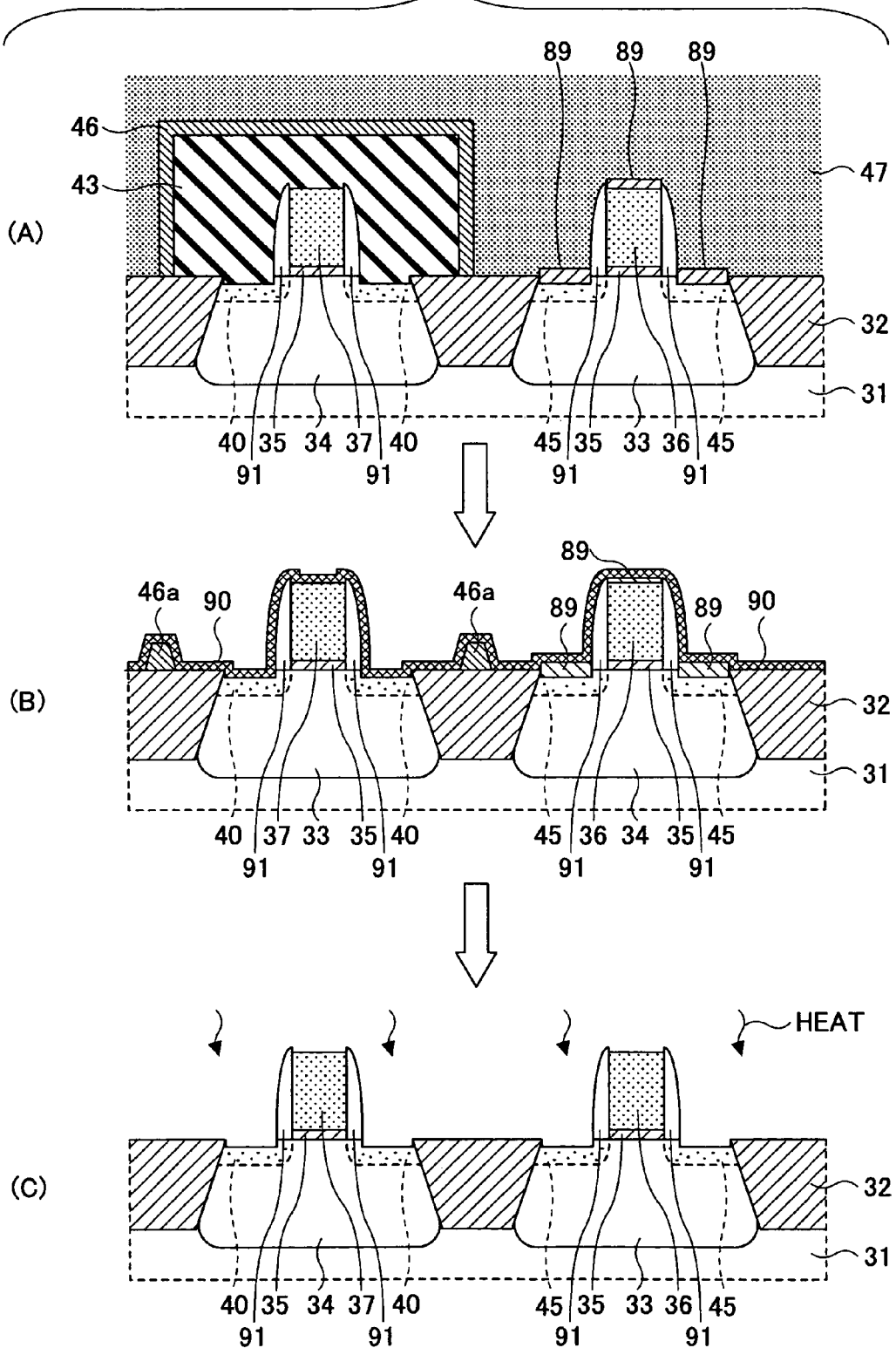
FIG. 25 is a third view for explaining an ashing step of a ninth example of the present invention.

The deformed layer 41 and the resist mask 43 are removed by the ashing process at the step of FIG. 25-(A). More specifically, the same conditions are used as the conditions of the step of FIG. 23-(C). The ashing process may be implemented during a period approximately 1.5 through 2 times the period from start of the process to completion of removal of the deformed layer 46 and the resist mask 43. As a result of this, the deformed layer 46 and the resist mask 43 are completely removed and the oxidization film having thickness of approximately 1 nm through 2 nm is formed on the surface of the electrode 36 and the silicon substrate of the p-type well region 34.

In the step of FIG. 25-(B), while the vacuum environment is kept, by using the Chemical Vapor Deposition (CVD) method, a protection film 90 is formed so as to cover the surface of a structural body where the resist mask 43 and the deformed layer 46 of FIG. 25-(A) are removed. In other words, the protection film 90 covers the silicon substrate surfaces of the n-type source/drain regions 40 and the silicon substrate surface (oxidization film) of the p-type source/drain regions 45, the gate electrodes 36 and 37, the side wall dielectric film 91, and the element isolation region 32.

The same step as the step of FIG. 24-(A) is applied for forming the protection film 90. By setting the thickness of the oxidization film 89 to be equal to or less than 2 nm, a concavity of the surface of the p-type source/drain region 45 generated in the step of FIG. 25-(C) may be shallow and decrease of the depth of the p-type source/drain region 45 due to the forming of the oxidization film 89 is prevented. Therefore, the increase of the sheet resistance of the p-type source/drain region 45 is prevented.

As gas for the ashing process in this step as well as the step of FIG. 23-(C), $N_2$ gas and $H_2$ gas can be used. As a result of this, the increase of the sheet resistance of the p-type source/drain region 45 is further prevented.

In the step of FIG. 25-(B), the substrate is taken out from the deposition room to the atmosphere. The gate electrode 37 and the n-type source/drain region 40 where the P ions having dose amount of $6 \times 10^{15}$ cm$^{-2}$ are implanted are covered with the protection film 90. Therefore, even if the temperature of the substrate is approximately 80° C. or higher, since P in the gate electrode 37 and the n-type source/drain region 40 do not come in contact with the moisture in the atmosphere, the generation of $H_3PO_4$ is prevented so that the generation of the Si digging defects is further prevented. In addition, since the substrate can be taken out to the atmosphere before the temperature of the substrate is decreased, it is possible to prevent the decrease of throughput generated due to addition of the forming step of the protection film 90.

Next, in the step of FIG. 25-(C), the protection film 90 and the residual 46a are removed by the same process as the process used in the step of FIG. 24-(B).

Furthermore, in the step of FIG. 25-(C), P ion and B ions are activated. The substrate is taken into the annealing device for thermal processing at, for example, approximately 1000° C., and thereby P ions and B ions are activated. As a result of this, P ions are bonded with atoms of silicon and a stable state is formed. Hence, after this step, the generation of Si digging defects can be prevented.

After the step of FIG. 25-(C), a siliciding step, a wiring forming step, a passivation film forming step, and others are implemented so that the semiconductor device is formed.

Thus, in the ninth example of the present invention, after the ashing process, the protection film 85 covering the surface of the gate electrode 37 and the silicon substrate of the n-type source/drain region 40 where P is implanted is formed. Therefore, the surface of the gate electrode 37 and the silicon substrate of the n-type source/drain region 40 are covered. Hence, the generation of Si digging defects can be prevented.

In addition, after B ions are implanted so that the p-type source/drain region 45 is formed and the ashing process is implemented, the protection film 90 covering the surface of the gate electrode 37 and the silicon substrate of the n-type source/drain region 40 where P is implanted is formed. Therefore, the generation of Si digging defects can be further prevented.

In the ashing process step of FIG. 23-(C) and FIG. 25-(A), instead of the microwave type down flow ashing device, an ICP (Inductively Coupled Plasma) type down flow ashing device can be used. As a result of this, since the density of the neutral radical is improved, the efficiency in removing the deformed layer and the resist mask can be improved so that processing time can be shortened.

In addition, in processes for forming the protection film of the steps of FIG. 24-(A) and FIG. 25-(B), instead of the vacuum CVD device, an ICP type CVD device may be used.

In this case, for example, the silicon oxidization film is formed so as to have thickness of 1 nm through 5 nm, by introducing, for example, 1000 sccm of $SiH_4$ gas and 20000 sccm of $N_2O$ gas to a deposition room, heating the substrate at 400° C. under the vacuum environment of 3 Torr, and applying RF power of frequency of 800 kHz to the substrate, and applying RF power (2 kW, for example) of frequency of 13.65 MHz to the ICP coil.

By using the ICP type CVD device, it is possible to improve the deposition rate of the protection film and therefore processing time can be shortened. As the protection film, an SiC film having thickness of, for example, 1 nm through 5 nm, and formed by process gas of $Si-4CH_3$ gas and $CO_2$ gas, can be used.

The steps of FIG. 23-(C) and FIG. 24-(A), or the ashing process step and the protection deposition step of FIG. 25-(A) and FIG. 25-(B) may be implemented by using a combined device of the ashing process device and the CVD device.

The present invention is not limited to these embodiments, but variations and modifications may be made without departing from the scope of the present invention.

For example, in the above-discussed example, the ashing step based on the B ion implantation is implemented under conditions different from conditions of the ashing step based on the P ion implantation. However, the ashing step based on the B ion implantation may be implemented under conditions the same as the conditions of the ashing step based on the P ion implantation. As a result of this, it is not necessary to change the ashing process recipient for every impurity species.

Furthermore, in the above-discussed example, the ashing step based on the P ion implantation is implemented in the neutral radical environment. However, the present invention is not limited to the neutral radical environment. This ashing process may be implemented in a plasma environment as it is generated.

In addition, in the above-discussed example, the entire ashing step based on the P ion implantation is implemented in the same excitation gas environment. However, the present invention is not limited to this example. After the deformed layer is removed, the supply of $CF_4$ gas may be stopped and the ashing process of a non-deformed resist mask may be implemented under the excitation gas environment of $O_2$ gas and $N_2$ gas.

Furthermore, in the first example of the present invention, the ashing step based on the P ion implantation is implemented at the same substrate temperature. However, the present invention is not limited to this example. For example, the substrate temperature just before the completion of the ashing process may be equal to or less than 130° C. The ashing process may be implemented at a higher temperature such as 150° C. at the initial time of the ashing process.

In addition, the ashing process may be applied at the substrate temperature equal to or less than 130° C. at the initial time of the ashing process and the substrate temperature just before the completion of the ashing process may be lower than the substrate temperature at the initial time of the ashing process. As a result of this, the generation of Si digging defects can be surely prevented.

Furthermore, in the above-discussed example, the Si digging phenomenon is discussed as a phenomenon occurring at the n-type gate electrode and the n-type source/drain region where P is implanted. However, the generation of the Si digging phenomenon is not limited to the region having these functions. The Si digging phenomenon occurs in the entire region where P ions are implanted.

For example, in the above-discussed example, the Si digging phenomenon is discussed as a phenomenon occurring in the step forming the source/drain region. However, such a phenomenon occurs in a step forming an n-type well region, n-type channel doping step, a step forming an n-type extension region, and others. Especially, in the case of a dose amount equal to or greater than $5 \times 10^{15}$ $cm^{-2}$, especially a dose amount equal to or greater than $6 \times 10^{15}$ $cm^{-2}$, it is preferable to apply the ashing step. Although there is no limitation of an upper limit of the does amount, the upper limit of the does amount should be set to solubility limit of P in the silicon. This is because, if P having the dose amount exceeding this solubility limit, bad influence such as degradation of crystallinity if silicon may be given. In addition, the upper limit of the dose amount of P to a region where high density impurities are required to be implanted, such as the source/drain region or polysilicon of the gate electrode, is preferably $2 \times 10^{16}$ $cm^{-2}$.

Furthermore, this phenomenon occurs when the P ions are implanted into a base region of a pnp bipolar transistor, an emitter region of npn bipolar transistor, an n-type diffusion resistance region, or polysilicon layer before wire state patterning is made.

In addition, since $H_3PO_4$ etches a silicon nitride film, this Si digging phenomenon includes a silicon nitride film digging phenomenon of the silicon nitride film covering the semiconductor substrate.

Furthermore, in the example of the present invention, the silicon substrate is discussed as the example. However, the present invention is not limited to the silicon substrate. The present invention can be applied to the silicon layer forming the element forming region in an SOS structure or SOI structure.

In addition, the present invention is not limited to the silicon substrate or the silicon layer. The present invention may be applied to an SiGe substrate or an SiGe layer and SiGe substrate or an SiGe layer where C is added.

Furthermore, in the example of the present invention, the polysilicon layer is discussed as an example of a wiring layer. However, the present invention is not limited to this example. For example, a polycrystal silicon layer including Al or a polycrystal SiGe layer is applied as the wiring layer.

In addition, in the example of the present invention, the ashing processing device is discussed as a device directly taking out the processed substrate to the atmosphere via the gate valve. However, the present invention can be applied to the ashing processing device having a load lock room. In this case, even if the cooling mechanism is not provided at the load lock room, after the ashing process of a final processed substrate is completed, the substrate can be taken out to the atmosphere without cooling time just after being taken into the load lock room.

Furthermore, in the third example of the present invention, the cooling mechanism such as a circulating mechanism of a coolant may be provided at the arm so that the temperature of the arm is constant and heat exchanging between the arm and the wafer can be made well. Alternatively, the arm may be made to contact the coolant provided outside of the ashing processing device at the time of stand-by so as to be cooled. As a result of this, the phenomenon of increase of the temperature of the arm due to heat collected with the number of processed substrates can be avoided.

Furthermore, in the sixth example of the present invention, a thermal process for activating is implemented by using the neighboring annealing device via the gate valve. However, the present invention is not limited to this example. For example, the thermal process may be implemented continuously in the ashing processing device by providing a lamp for annealing at the annealing processing device and using an RTA (Rapid Thermal Anneal) process. In addition, the ashing process of the first through fifth, the seventh, and the eighth examples may be implemented as the ashing process after the P ions are implanted and until the P ions are activated.

As a result of this, the generation of Si digging defects is further prevented.

The present invention can be typically applied to the ashing step based on the P ions in the manufacturing process of the semiconductor device. However, the present invention is not limited to the manufacturing process of the semiconductor device. The present invention can be applied to a manufacturing process of other electronic devices such as an active substrate of a liquid crystal panel or an organic EL panel. In this case, the subject of the P ion implantation may be polycrystal silicon or amorphous silicon.

This patent application is based on Japanese Priority Patent Application No. 2005-210353 filed on Jul. 20, 2005 and Japanese Priority Patent Application No. 2006-184884 filed on Jul. 4, 2006, the entire contents of which are hereby incorporated by reference.

What is claimed is:

1. A manufacturing method of an electronic device, comprising:
    implanting P (phosphorous) ions into a substrate semiconductor region made of Si or SiGe by using a resist as a mask;
    ashing the resist while it is heated in a vacuum environment;
    taking out the substrate, the substrate being ashing processed so that a temperature of the substrate is equal to or less than 130° C; and
    modifying the surface of the semiconductor region to be water repellent in the vacuum environment, after the ashing and before the taking out the substrate.

2. The manufacturing method of the electronic device as claimed in claim 1,
    wherein the temperature of the substrate at, at least, an end time of the ashing step is equal to or less than 130° C.

3. The manufacturing method of the electronic device as claimed in claim 1,
    wherein liquid deforming to water repellency is sprayed to the surface of the substrate in the modifying the surface of the semiconductor region.

4. The manufacturing method of the electronic device as claimed in claim 1,
    wherein, in the step of ashing, an excitation gas whose main ingredient is oxygen is used.

5. The manufacturing method of the electronic device as claimed in claim 1,
    wherein the step of ashing is implemented in a same excitation gas environment from an initial time to the end time of the step of ashing.

6. The manufacturing method of the electronic device as claimed in claim 1,
    wherein the step of ashing is implemented at the same substrate temperature from an initial time to an end time of the step of ashing.

7. The manufacturing method of the electronic device as claimed in claim 1, further comprising:
    implanting an ion of an impurity chemical element other than P (phosphorous) to the substrate semiconductor region made of Si or SiGe by using other resist as a mask after the step of taking out the substrate to the atmosphere;
    ashing the other resist while it is heated in a vacuum environment; and
    taking out the substrate, the substrate being ashing processed so that the temperature of the substrate is equal to or less than 130° C.

8. The manufacturing method of the electronic device as claimed in claim 1, further comprising the steps of: implanting an ion of an impurity chemical element other than P (phosphorous) to the semiconductor region made of Si or SiGe by using another resist as a mask after the taking out the substrate to the atmosphere;
    ashing the other resist while it is heated in a vacuum environment;
    forming other protection film covering a surface of the semiconductor region where the impurity chemical element other than P (phosphorous) is implanted in the vacuum environment;
    taking out the substrate where the other protection film is formed to the atmosphere; and
    removing the other protection film after the substrate is cooled.

9. The manufacturing method of the electronic device as claimed in claim 8, further comprising:
    thermal processing the substrate for activating the impurity chemical element other than P (phosphorous) after the removing the other protection film.

10. The manufacturing method of the electronic device as claimed in claim 1,
    wherein an implantation density of P (phosphorous) is equal to or greater than $5 \times 10^{15}$ cm$^{-2}$.

11. The manufacturing method of the electronic device as claimed in claim 10,
    wherein an implantation density of P (phosphorous) is equal to or greater than $6 \times 10^{15}$ cm$^{-2}$.

12. The manufacturing method of the electronic device as claimed in claim 1, further comprising:
    cooling the substrate forcibly in the vacuum environment, after the step of ashing and before the taking out the substrate.

13. The manufacturing method of the electronic device as claimed in claim 12,
    wherein, in the cooling, cooling gas is sprayed onto the semiconductor region.

14. The manufacturing method of the electronic device as claimed in claim 12, wherein, in the step of cooling, a subject having a temperature lower than the temperature of the substrate just after the ashing step comes in contact with a part of the substrate equal to or greater than three-fourths of a bottom area of the substrate.

15. The manufacturing method of the electronic device as claimed in claim 14, wherein the subject is an arm configured to support the substrate and take out the substrate to the atmosphere; and the arm is cooled so as to have a temperature lower than environmental temperature.

16. The manufacturing method of the electronic device as claimed in claim 15, wherein a cooling medium comes in contact with the arm so that the arm is cooled.

* * * * *